(12) United States Patent
Blomberg et al.

(10) Patent No.: US 9,412,602 B2
(45) Date of Patent: Aug. 9, 2016

(54) DEPOSITION OF SMOOTH METAL NITRIDE FILMS

(71) Applicant: ASM IP Holding B.V., Almere (NL)

(72) Inventors: Tom E. Blomberg, Vantaa (FI); Jaakko Anttila, Helsinki (FI)

(73) Assignee: ASM IP Holding B.V., Almere (NL)

( * ) Notice: Subject to any disclaimer, the term of this patent is extended or adjusted under 35 U.S.C. 154(b) by 4 days.

(21) Appl. No.: 13/802,157

(22) Filed: Mar. 13, 2013

(65) Prior Publication Data

US 2014/0273452 A1     Sep. 18, 2014

(51) Int. Cl.
*H01L 21/285* (2006.01)
*H01L 21/768* (2006.01)
*C23C 16/34* (2006.01)
*C23C 16/455* (2006.01)

(52) U.S. Cl.
CPC .......... *H01L 21/28562* (2013.01); *C23C 16/34* (2013.01); *C23C 16/45529* (2013.01); *C23C 16/45531* (2013.01); *H01L 21/7684* (2013.01); *H01L 21/76877* (2013.01)

(58) Field of Classification Search
USPC ........................................................ 438/763
See application file for complete search history.

(56) References Cited

U.S. PATENT DOCUMENTS

| | | | |
|---|---|---|---|
| 6,902,763 B1 * | 6/2005 | Elers | C23C 16/34 257/E21.171 |
| 7,279,432 B2 * | 10/2007 | Xi | H01L 21/28562 257/E21.013 |
| 7,851,307 B2 * | 12/2010 | Ramaswamy | H01L 21/28273 438/257 |
| 2003/0054628 A1 * | 3/2003 | Leng | H01L 21/2855 438/622 |
| 2007/0026671 A1 * | 2/2007 | Kim | H01L 21/76843 438/648 |
| 2009/0152620 A1 * | 6/2009 | Ahn | C23C 16/40 257/324 |
| 2009/0211526 A1 * | 8/2009 | Tanaka | C23C 16/4412 118/715 |

OTHER PUBLICATIONS

Chookarjorn et al, "Design of Stable Nanocrystalline Alloys," Science Magazine, vol. 337, pp. 951-954, Aug. 24, 2012.
Triyoso, D.H. et al, "Characteristics of Mixed Oxides and Nanolaminates of Atomic Layer Deposited $HfO_2$-$TiO_2$ Gate Dielectrics," Journal of The Electrochemical Society, 153 (9), pp. 834-839, 2006.

* cited by examiner

*Primary Examiner* — Ali Naraghi
(74) *Attorney, Agent, or Firm* — Knobbe, Martens, Olson & Bear, LLP

(57) ABSTRACT

In one aspect, methods of forming smooth ternary metal nitride films, such as $Ti_xW_yN_z$ films, are provided. In some embodiments, the films are formed by an ALD process comprising multiple super-cycles, each super-cycle comprising two deposition sub-cycles. In one sub-cycle a metal nitride, such as TiN is deposited, for example from $TiCl_4$ and $NH_3$, and in the other sub-cycle an elemental metal, such as W, is deposited, for example from $WF_6$ and $Si_2H_6$. The ratio of the numbers of each sub-cycle carried out within each super-cycle can be selected to achieve a film of the desired composition and having desired properties.

21 Claims, 14 Drawing Sheets

FIG. 8A
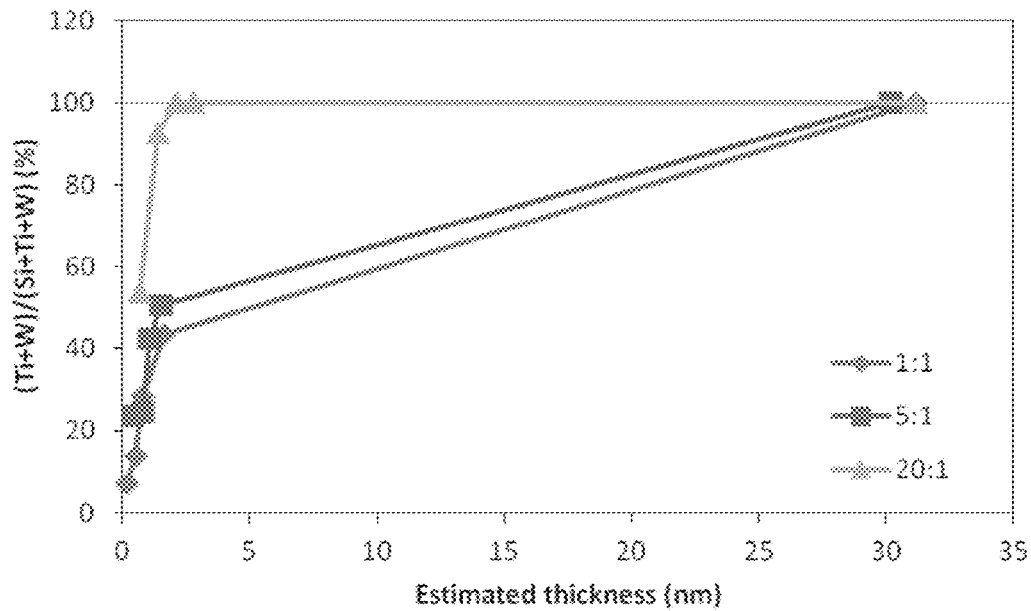
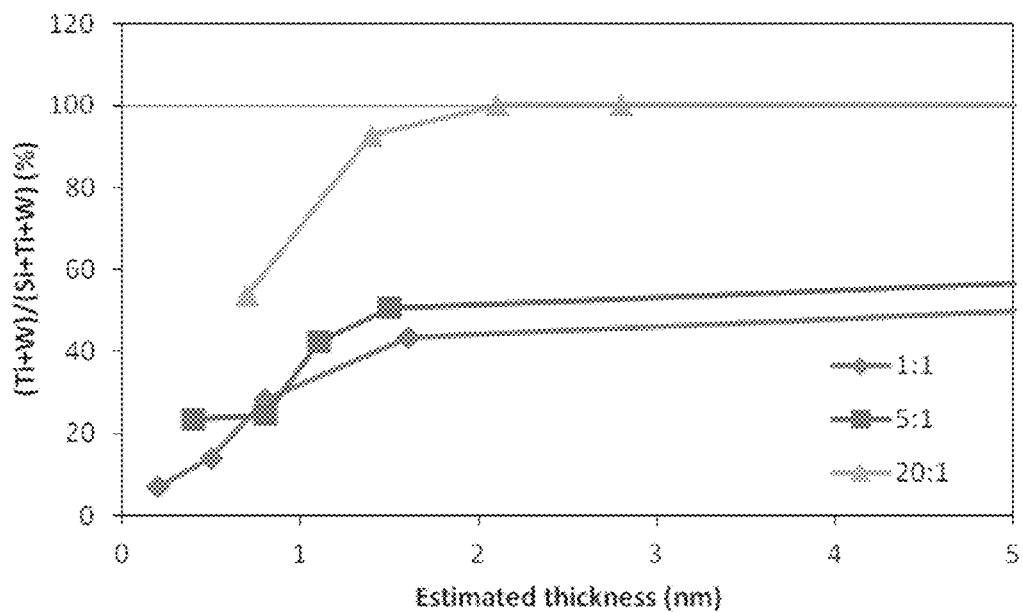
FIG. 8B

FIG. 9A
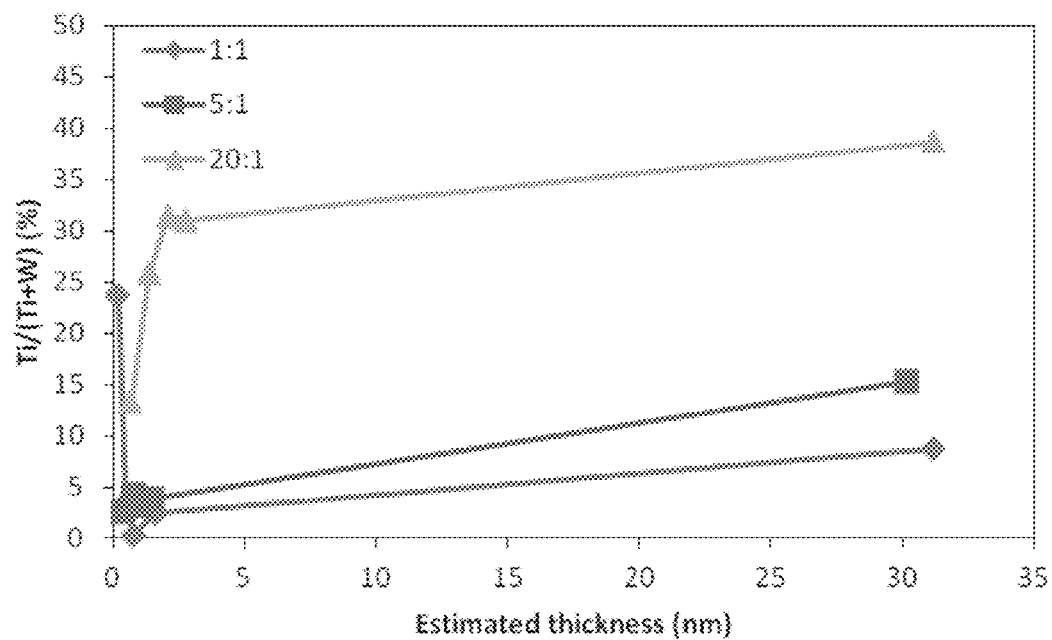
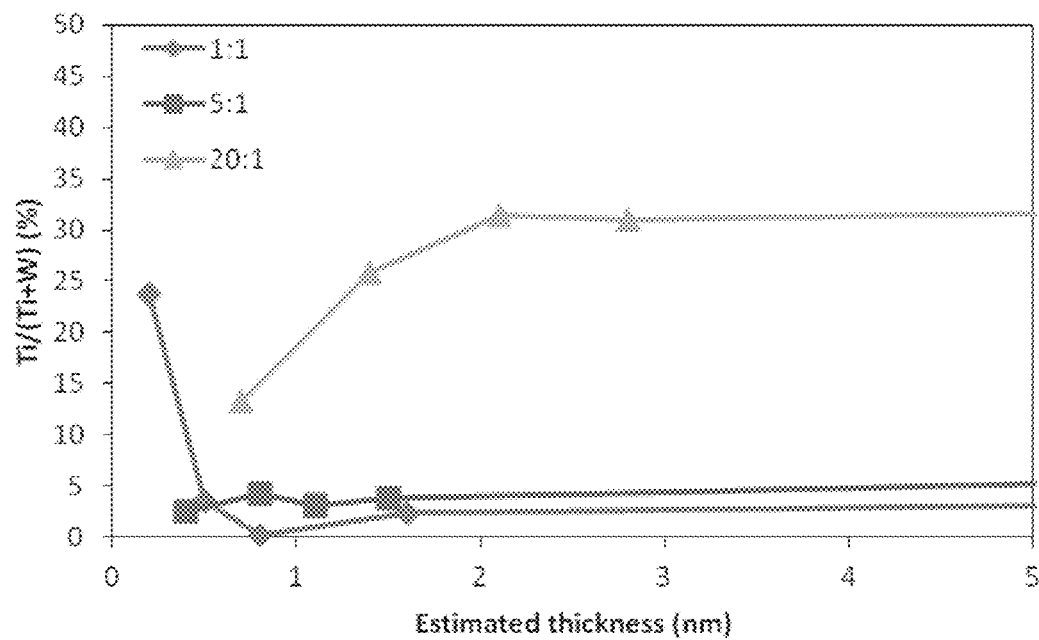
FIG. 9B

DEPOSITION OF SMOOTH METAL NITRIDE FILMS

BACKGROUND OF THE INVENTION

1. Field of the Invention

The invention relates generally to the field of semiconductor device manufacturing and, more particularly, to methods for forming metal nitride films by a combination of atomic layer deposition (ALD) processes for depositing metal nitride and elemental metal. For example, smooth $Ti_xW_yN_z$ films may be formed by utilizing atomic layer deposition processes for depositing TiN and W.

2. Description of the Related Art

Atomic layer deposition (ALD) is based on sequential, self-saturating surface reactions, which can provide good conformality and step coverage regardless of the geometry of the structure to be coated. However, deposition of metallic films by ALD has been challenging, in part because ALD is based essentially on thermodynamically favorable half-reactions. Apart from the noble metals, elements in their pure forms are not the thermodynamically most stable forms of the elements but rather their compounds. Therefore, the choice of precursors for depositing metallic films by ALD has been a challenging task.

Metallic compound films such as nitrides and carbides are easier to deposit by ALD compared to pure elemental films. However, the thermodynamic stability of these films is typically also substantially lower than their corresponding metal oxides and the same difficulty in the precursor chemistry choice arises as with the elemental films.

Refractory metal conducting layers are basic building blocks in micro and nano-electronics. Titanium nitride and tungsten layers are commonly used in the semiconductor manufacturing industry. Titanium nitride is used, for example, as a gate electrode material or as a copper diffusion barrier. Tungsten is mainly used as the contact plug material in metal 1 level interconnects. Both materials can be deposited by physical vapor deposition (PVD), by chemical vapor deposition (CVD) or by ALD methods. For ultra-high aspect ratio structures found in the current state of the art microelectronic chips and in future nodes, ALD deposition methods are preferred because they are capable of providing better conformality and step coverage.

In addition to the electrical properties of the metal films, such as resistivity and work function, one of the most important properties of the films is their microstructure. Metallic films favor a polycrystalline phase, often having specific grain morphology. During the deposition process, many metals adopt columnar grain morphology with a certain preferred crystal orientation relative to the substrate. The grain boundaries between the columnar grains present discontinuities in the material, which alter the mechanical and electrical properties of the films and may serve as diffusion channels for impurities. As a result, the desired material properties are degraded compared to their amorphous or single crystal phases. In the case of nanocrystalline alloys however, the grain boundaries may also have a positive effect on the material properties, namely by thermodynamically stabilizing the nanocrystalline phase of the alloy through the segregation of the elemental distributions of the alloy elements between the grain boundaries and the bulk of the grains.

SUMMARY OF THE INVENTION

In one aspect, atomic layer deposition (ALD) processes are provided for depositing metal nitride thin films. In some embodiments the ALD processes may comprise a plurality of super-cycles, where at least one super-cycle comprises two sub-cycles: a first sub-cycle for forming metal nitride and a second sub-cycle for forming elemental metal. The sub-cycles are repeated a predetermined number of times and at a predetermined ratio in one or more super-cycles to deposit a metal nitride film of the desired composition and thickness.

In some embodiments, a ternary metal nitride film comprising two different metals, $M^1$ and $M^2$, is deposited on a substrate in a reaction chamber by an atomic layer deposition process comprising a plurality of super-cycles, where a super-cycle comprises a metal nitride sub-cycle and an elemental metal sub-cycle.

In some embodiments the metal nitride sub-cycle comprises pulsing a first vapor-phase metal precursor comprising a first metal $M^1$ into the reaction chamber. In some embodiments at most a molecular layer of the first metal precursor is formed on the substrate. A vapor phase nitrogen precursor is subsequently pulsed into the reaction chamber where it reacts with the first metal precursor on the substrate to form a metal nitride. In some embodiments $M^1$ is selected from Ti, Ta, Nb, Mo, and W. The first metal precursor may comprise, for example, a metal halide or metal-organic compound. In some embodiments the nitrogen reactant may comprise ammonia, $N_2H_4$, nitrogen atoms, nitrogen containing plasma or nitrogen radicals.

In some embodiments the elemental metal sub-cycle comprises pulsing a second vapor phase metal precursor comprising a second, different metal $M^2$ into the reaction chamber. In some embodiments at most a molecular monolayer of second metal precursor is formed on the substrate. A vapor phase second reactant is pulsed into the reaction chamber where it reacts with the second metal precursor to form elemental metal. The second reactant may comprise, for example, a silane or borane, such as disilane or trisilane.

In another aspect, ALD processes for depositing a ternary metal nitride film on a substrate are provided, where the ALD processes may comprise a plurality of deposition super-cycles. One or more of the super-cycles comprises a TiN deposition sub-cycle and a W deposition sub-cycle. The sub-cycles are repeated a predetermined number of times and at a predetermined ratio in one or more super-cycles to deposit a metal nitride film of the desired composition and thickness.

In some embodiments the TiN deposition sub-cycle comprises alternately and sequentially contacting the substrate with a titanium precursor and a nitrogen reactant. In some embodiments the titanium precursor is a titanium halide or metal-organic titanium compound. For example, the titanium precursor may be $TiCl_4$. The nitrogen reactant may, for example, be selected from the group consisting of ammonia, $N_2H_4$, nitrogen atoms, nitrogen containing plasma and nitrogen radicals.

In some embodiments the W deposition sub-cycle comprises alternately and sequentially contacting the substrate with a tungsten precursor and a second precursor, where the second precursor is a silane or borane. In some embodiments the tungsten precursor is a tungsten halide or metal organic tungsten compound. For example, the tungsten precursor may be $WF_6$. The second precursor may comprise, for example, silane or disilane.

In some embodiments the TiN deposition sub-cycle and the W sub-cycle are carried out at a ratio of at least about 3 in at least one of the plurality of super-cycles.

In some embodiments the metal nitride layer forms a continuous layer. In some embodiments the metal nitride layer is not a nanolaminate.

In another aspect, methods for forming ternary metal nitride films on a substrate in a reaction chamber may comprise a first metal nitride sub-cycle and a second elemental metal sub-cycle, where the metal nitride sub-cycle and the elemental metal sub-cycle are repeated to form the ternary metal nitride film at a desired thickness.

In some embodiments the first metal nitride sub-cycle may comprise contacting the substrate with a vapor phase first metal precursor and a nitrogen reactant. The second elemental metal sub-cycle may comprise contacting the substrate with a vapor phase second metal precursor and a second reactant. The metal in the first metal precursor may be different from the metal in the second metal precursor. In some embodiments the elemental metal sub-cycle is performed before the metal nitride sub-cycle.

In some embodiments the first metal nitride sub-cycle and the second elemental metal sub-cycle are performed at a selected ratio in one or more super-cycles. In addition, the number of sub-cycles may be limited in each super-cycle. For example, the first sub-cycle may be repeated no more than about 40 times consecutively prior to the second sub-cycle in some embodiments. In some embodiments the second sub-cycle is performed no more than about 10 times consecutively in each of the plurality of super-cycles.

In some embodiments a ternary metal nitride film is deposited that has a roughness of less than about 2 nm at a thickness of about 20 to about 50 nm, as measured by x-ray reflectivity (XRR).

In some embodiments the ratio of sub-cycles is selected such that the film is electrically continuous i.e. conducts current at very thin thicknesses, such as less than about 3 nm, less than about 2 nm, less than about 1.5 nm or even less than about 1.0 nm

BRIEF DESCRIPTION OF THE DRAWINGS

The invention will be better understood from the detailed description and from the appended drawings, which are meant to illustrate and not to limit the invention, and wherein:

FIGS. 8A and B illustrate (Ti+W)/(Si+Ti+W) or layer closure as a function of estimated layer thickness. FIG. 8B is an expanded view of FIG. 8A.

FIGS. 9A and B show Ti/(Ti+W) as a function of estimated layer thickness. FIG. 9B is an expanded view of FIG. 9A.

DETAILED DESCRIPTION OF THE PREFERRED EMBODIMENT

Figure 1:
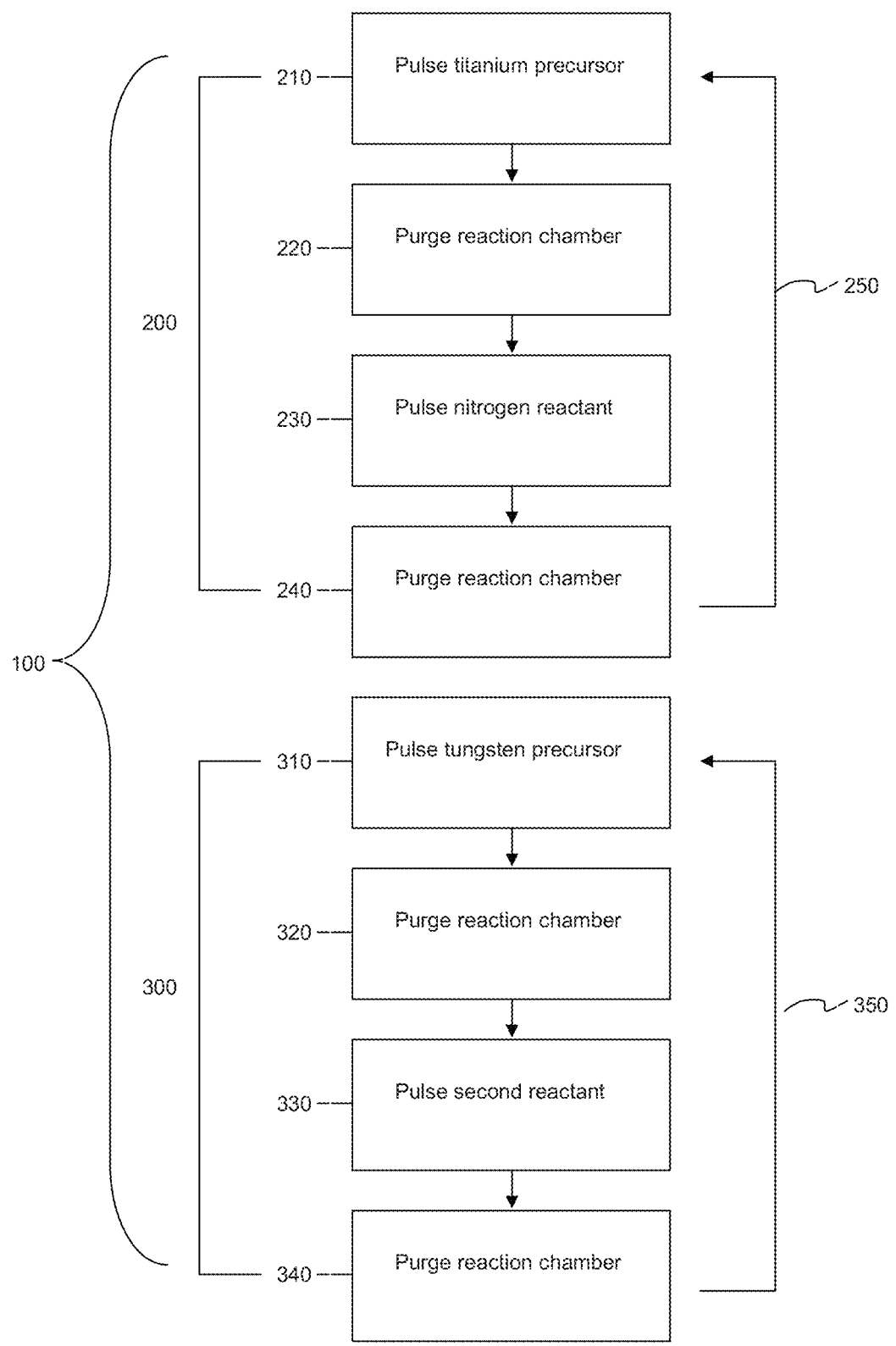
FIG. 1 is a flow chart illustrating an ALD process for depositing a $Ti_xW_yN_z$ film according to one embodiment.

As mentioned above, metal nitride, such as titanium nitride, and elemental metal, such as tungsten, are commonly used in the semiconductor industry, for example as gate metals, contact plugs and MIM electrodes. The present application is based, in part, on the unexpected finding that two ALD processes, one for depositing a metal nitride and one for depositing elemental metal, can be used together to produce a metal nitride film. In some embodiments one ALD process for depositing TiN and one for depositing W can be used together to produce a metal nitride film, such as a $Ti_xW_yN_z$ film. The film may have advantageous properties relative to known TiN or W films. Each process alone produces films with significant roughness and a columnar grain structure, which are undesirable properties for many electronic applications. For example, for copper barrier applications a columnar grain structure can allow copper to diffuse through grain boundaries. However a combination of the processes, as described herein, can be used to produce films with improved properties.

As described in more detail below, by mixing two ALD processes for depositing metal nitride and elemental metal, for example for depositing TiN and W, metal nitride films, such as $Ti_xW_yN_z$ films, can be formed. The films may have improved properties relative to the TiN and/or W films deposited individually or other similar metal nitrides. In particular, in some embodiments smooth, conductive films where the columnar structure is reduced or absent can be formed. In addition, continuous ultra-thin films, for example less than 3 nm, can be deposited. Moreover, by adjusting the ratio of the two processes, various physical properties of the films can be adjusted, such as the resistivity and mechanical properties such as density. In some embodiments, a solid solution of nanocrystalline TiN and $W_2N$ is formed using processes for depositing TiN and W.

The ALD processes described below can be used to deposit metal nitride films, which can be referred to as $M^1M^2N$ films, where $M^1$ and $M^2$ are different metals, such as TiWN. The stoichiometry, and thus the relative amounts of $M^1$, $M^2$ and N, can vary. For example, the relative amounts of Ti, W and N in a TiWN film can vary. Thus, the films are referred to herein primarily as $M^1_xM^2_yN_z$ films, for example $Ti_xW_yN_z$ films. The variables x, y and z will vary depending on the particular deposition process and conditions. In some embodiments x is from about 0, or just above, to about 1.5, y is from about 0.05 to about 4 and z is from about 0, or just above, to about 2 In some embodiments the stoichiometry is near the range of the stoichiometry of a solid solution of TiN and $W_2N$. In some embodiments x is from about 0, or just above, to about 1, y is from about 0.1 to about 1 and z is from about 0, or just above, to about 0.8. In some embodiments x is from about 0, or just above, to about 0.5, y is from about 0.3 to about 0.95 and z is from about 0.05 to about 0.5 The amount of each element in the film can be controlled, for example by controlling the ratio of the metal nitride to elemental metal deposition cycles.

In some embodiments in which a $Ti_xW_yN_z$ film is deposited, the amount of titanium, nitrogen and tungsten in the films can be controlled by controlling the ratio of TiN and W deposition sub-cycles, as described in detail below. For example, if the TiN:W sub-cycle ratio is less than or equal to about 1, $W_yN_z$ films with a nitrogen content of less than about 10 at.-% can be produced. These films do not comprise an appreciable amount of titanium ($x \approx 0$). With TiN/W cycle rations higher than about 3, thin films comprising ternary $Ti_xW_yN_z$ solid solutions are formed. The variable z will not be zero for a ternary film, but if the TiN:W pulsing ratio is 0, the resulting film will be pure tungsten and z will be zero. The titanium content increases less than the nitrogen content with an increasing TiN/W cycle ratio. Without being bound to any theory, it is believed that in some circumstances a solid solution may be formed, leading to a phenomenon called solid solution strengthening.

In some embodiments, methods of forming a$M^1_xM^2_yN_z$ film comprise a first ALD sub-cycle in which metal nitride is deposited by alternately and sequentially contacting a substrate with a metal precursor, such as a metal halide, and a nitrogen reactant, such as $NH_3$, and a second ALD sub-cycle in which elemental metal is deposited by alternately and sequentially contacting the substrate with a metal reactant, such as a metal halide and a second reactant, such as $Si_2H_6$. The two sub-cycles together form a super-cycle that can be repeated as many times as desired to achieve a film of an appropriate thickness for a particular application. Within each super-cycle, the ratio of metal nitride to metal sub-cycles can be adjusted to achieve a desired film composition and properties.

In some embodiments, methods of forming a $Ti_xW_yN_z$ film comprise a first ALD sub-cycle in which titanium nitride is deposited by alternately and sequentially contacting a substrate with a titanium precursor, such as $TiCl_4$ and a nitrogen reactant, such as $NH_3$, and a second ALD sub-cycle in which tungsten is deposited by alternately and sequentially contacting the substrate with a tungsten reactant, such as $WF_6$ and a second reactant, such as $Si_2H_6$. The two sub-cycles together form a super-cycle that can be repeated as many times as desired to achieve a film of an appropriate thickness for a particular application. Within each super-cycle, the ratio of TiN to W sub-cycles can be adjusted to achieve a desired film composition and properties.

In some embodiments the $M^1_xM^2_yN_z$ film is not a nanolaminate and separate layers of metal nitride and elemental metal are not visible. In some embodiments less than about 60 or less than about 40 consecutive metal nitride deposition sub-cycles ($M^1_xN_z$) are carried out in a super-cycle. In some embodiments less than about 10 or less than about 5 consecutive elemental metal deposition sub-cycles ($M^2_y$) are carried out in a super-cycle.

For example, in some embodiments a $Ti_xW_yN_z$ film is not a nanolaminate film or a film in which distinct and separate layers of tungsten and titanium nitride are observable. In some embodiments less than about 60 or less than about 40 consecutive TiN deposition sub-cycles are carried out in a super-cycle. In some embodiments less than 10 or less than about 5 consecutive W deposition sub-cycles are carried out in a super-cycle.

The concentration of the first metal, nitrogen and second metal can be varied to change the properties of the $M^1_xM^2_yN_z$ film. For example, the concentration of titanium, nitrogen and tungsten can be varied to change the properties of a $Ti_xW_yN_z$ film. In some embodiments a $Ti_xW_yN_z$ film comprises a higher concentration of titanium than tungsten. In some embodiments a $Ti_xW_yN_z$ film comprises a higher concentration of tungsten than titanium.

While illustrated primarily in the context of forming $Ti_xW_yN_z$ films, other metal nitride films can be deposited using an ALD super-cycle comprising a metal nitride sub-cycle and an elemental metal sub-cycle.

In some embodiments, methods of forming a $M^1_xM^2_yN_z$ film comprises a plurality of ALD super-cycles, at least one super-cycle comprising a sub-cycle for forming $M^1_xN_z$, wherein $M^1$ can be selected from Ti, Ta, Nb, Mo and W, and a sub-cycle for depositing elemental metal $M^2$, wherein $M^2$ is W or Mo. In the first ALD sub-cycle, $M^1$ nitride is deposited by alternately and sequentially contacting a substrate with a precursor containing metal $M^1$, such as a metal halide, and a nitrogen reactant, such as $NH_3$. In the second ALD sub-cycle elemental metal $M^2$ is deposited by alternately and sequentially contacting the substrate with a reactant containing metal $M^2$, such as a metal halide and a second reactant, such as silane, like $Si_2H_6$, or borane, like $B_2H_6$. The two sub-cycles together form a super-cycle that can be repeated as many times as desired to achieve a film of an appropriate thickness for a particular application. Within each super-cycle, the ratio of metal nitride subcycles ($M^1_xN_z$) to elemental metal ($M^2$) sub-cycles can be adjusted to achieve a desired film composition and properties.

In some embodiments the methods of forming $M1'_xM^2_yN_z$ film, wherein $M^1$ can be selected from Ti, Ta, Nb, Mo and W, and $M^2$ is W or Mo, comprises combining two ALD processes, where the two individual processes are known to produce metal nitride films with columnar grain structure ($M^1$ based metal nitride film process) and elemental metal films with either columnar grain structure or a rough film ($M^2$ based elemental metal film process). In some embodiments the $M^1_xM^2_yN_z$ film is smooth and does not have columnar grain structure.

The concentration of the $M^1$, nitrogen and $M^2$ can be varied to change the properties of the $M^1_xM^2_yN_z$ film. In some embodiments the $M^1_xM^2_yN_z$ film comprises a higher concentration of $M^1$ than $M^2$. In some embodiments the $M^1_xM^2_yN_z$ film comprises a higher concentration of $M^2$ than $M^1$.

Atomic Layer Deposition (ALD)

ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant by-products from the reaction chamber between reactant pulses.

Briefly, a substrate is loaded into a reaction chamber and is heated to a suitable deposition temperature, generally at lowered pressure. In some embodiments the substrate comprises a 300 mm silicon wafer. In some embodiments the substrate comprises a 450 mm wafer. Deposition temperatures are maintained below the precursor thermal decomposition temperature but at a high enough level to avoid condensation of reactants and to provide the activation energy for the desired surface reactions. Of course, the appropriate temperature window for any given ALD reaction will depend upon the surface termination and reactant species involved.

A first reactant is conducted into the chamber in the form of vapor phase pulse and contacted with the surface of a substrate. Conditions are preferably selected such that no more than about one monolayer of the precursor is adsorbed on the substrate surface in a self-limiting manner. Excess first reactant and reaction byproducts, if any, are purged from the reaction chamber, often with a pulse of inert gas such as nitrogen or argon.

Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as when depositing layers over extremely high aspect ratio structures or other structures with complex surface morphology is needed. The appropriate pulsing times can be readily determined by the skilled artisan based on the particular circumstances.

A second gaseous reactant is pulsed into the chamber where it reacts with the first reactant bound to the surface. Excess second reactant and gaseous by-products of the surface reaction are purged out of the reaction chamber, preferably with the aid of an inert gas. The steps of pulsing and purging are repeated until a thin film of the desired thickness has been formed on the substrate, with each cycle leaving no more than a molecular monolayer. As discussed in detail below, in forming $M^1_xM^2_yN_z$ films, such as $Ti_xW_yN_z$ films, two deposition sub-cycles are repeated one or more times in each ALD super-cycle.

Additional reactants can also be supplied that, in some embodiments, do not contribute elements to the growing film. Such reactants can be provided either in their own pulses or along with precursor pulses, and can be used for example to provide a desired surface termination, or to strip or getter adhered ligands and/or free by-product.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus provides excellent step coverage. In some arrangements, the degree of self-limiting behavior can be adjusted by, e.g., allowing some overlap of reactant pulses to trade off deposition speed (by allowing some CVD-type reactions) against conformality. Ideal ALD conditions with reactants well separated in time and space provide near perfect self-limiting behavior and thus maximum conformality, but steric hindrance results in less than one molecular layer per cycle. Limited CVD reactions mixed with the self-limiting ALD reactions can raise the deposition speed.

Examples of suitable reactors that may be used include commercially available ALD equipment such as the F-120® reactor, Pulsar® reactor and Advance® 400. Series reactor, available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. In some embodiments a flow type ALD reactor is used.

In some embodiments the reactor is batch reactor and has more than about 50 substrates, more than about 100 substrates or more than about 125 substrates. In some embodiments the reactor is mini-batch reactor and has from 2 to about 20 substrates, from 3 to about 15 substrates or from 4 to about 10 substrates.

The $M^1_xM^2_yN_z$ and $Ti_xW_yN_z$ ALD processes described below can optionally be carried out in a reactor or reaction space connected to a cluster tool. In a cluster tool, because each reaction space is dedicated to one type of process, the temperature of the reaction space in each module can be kept constant, which improves the throughput compared to a reactor in which is the substrate is heated up to the process temperature before each run.

A stand-alone reactor can be equipped with a load-lock. In that case, it is not necessary to cool down the reaction space between each run.

$M^I_xM^{III}_yN_z$ Film Deposition

As mentioned above and discussed in detail below using TiN and W sub-cycles r cycles as an example for the formation of a $Ti_xW_yN_z$ film, $M^1_xM^2_yN_z$ films can be deposited using a metal nitride deposition sub-cycle and an elemental metal sub-cycle. In some embodiments $M^1$ can be selected from Ti, Ta, Nb, Mo and W, and $M^2$ is W or Mo. In some embodiments $M^1$ and $M^2$ are not the same metal. The two sub-cycles can be repeated at a desired ratio in a super-cycle to form a smooth and/or nanocrystalline film. In some embodiments the $M^1_xM^2_yN_z$ films do not have a columnar grain structure.

In some embodiments the $M^1_xM^2_yN_z$ deposition process is an ALD process. In some embodiments the $M^1_xM^2_yN_z$ film deposition process is a sequential or cyclic process, such as a sequential or pulsed CVD process utilizing the same precursor and conditions selections as an ALD process. In some embodiments the $M^1_xM^2_yN_z$ film deposition process has a step which is not self-limiting. In some embodiments the process may operate in a process condition regime close to CVD conditions or in some cases fully in CVD conditions.

In some embodiment a $M^1_xM^2_yN_z$ film deposition process may comprise multiple super-cycles, where each super-cycle comprises at least one $M^1_xN_z$ sub-cycle and at least one $M^2$ sub-cycle. In some embodiments, each deposition sub-cycle comprises alternately and sequentially contacting the substrate with a metal precursor and second precursor. The ratio of the $M^1_xN_z$ and $M^2$ sub-cycles can be varied to achieve the desired composition, and the number of super-cycles can be selected to deposit a metal nitride film of the desired thickness. The number of each sub-cycles conducted consecutively in a super-cycle is limited such that a mixed $M^1_xM^2_yN_z$ film is formed, and distinct $M^1_xN_z$ and $M^2$ layers are not visible.

The super-cycle can be written as:

a[b($M^1$-precursor+N-precursor)+c(second reactant+$M^2$-precursor)], where ($M^1$-precursor+N-precursor) represents $M^1_xN_z$ sub-cycle and b is the number of $M^1_xN_z$ sub-cycles in each super-cycle, (second reactant+$M^2$-precursor) represents the $M^2$ sub-cycle and c is the number of $M^2$ sub-cycles in each super-cycle and a is the number of super-cycles. The ratio of metal nitride to elemental metal cycles can be given as b:c.

The first and second deposition sub-cycles (b and c) may be provided at a selected ratio to deposit a thin film with a desired composition and desired properties. For example, in some embodiments the ratio of the first, metal nitride deposition sub-cycle to the second elemental metal deposition sub-cycle in one or more super-cycles may be from about 0.1 to about 100, about 0.25 to about 50 or about 0.5 to about 40. In some embodiments the ratio of metal nitride deposition sub-cycles to elemental metal sub-cycles in one or more super-cycles is less than one. In some embodiments the ratio of metal nitride deposition sub-cycles to elemental metal sub-cycles in one or more super-cycles is between about 1 and about 3. In some embodiments the ratio of metal nitride deposition sub-cycles to elemental metal sub-cycles in one or more super-cycles is between about 1 and about 50, between about 3 and about 30 or between about 5 and about 20. In some embodiments the ratio of metal nitride deposition sub-cycles to elemental metal sub-cycles in one or more super-cycles is about 0.5, about 1, about 3, about 5, about 10, about 20, about 40 or about 50.

In some embodiments the ratio of first metal nitride deposition sub-cycles to second elemental metal deposition sub-cycles is the same in all of the complete super-cycles performed in the process. In other embodiments the specific ratio of first metal nitride deposition sub-cycles to second elemental metal deposition sub-cycles can be varied in different complete super-cycles. The specific ratios can be selected by the skilled artisan to provide the desired amounts of $M^1$, nitrogen and $M^2$ in the film and thus to achieve a film with the desired properties.

Although referred to as the first metal nitride deposition sub-cycle and the second elemental metal deposition sub-cycle, in some embodiments one or more super-cycles begins with the elemental metal deposition sub-cycle, which is followed (after repeating a desired number of times) by the metal nitride deposition sub-cycle.

In some embodiments, the ultimate $M^1{}_xM^2{}_yN_z$ film that is formed will comprise more of $M^1$ than $M^2$. In some embodiments, the ultimate $M^1{}_xM^2{}_yN_z$ film that is formed will comprise more of $M^2$ than $M^1$. In some embodiments at least 30%, at least 50%, at least 80%, at least 90%, at least 95%, at least 98%, at least 99% or at least 99.5% of the metal in the $M^1{}_xM^2{}_yN_z$ film is $M^2$. In some embodiments less than 70%, less than 40%, less than 30%, less than 20%, less than 5%, less than 3%, less than 1% or less than 0.5% of the metal in the $M^1{}_xM^2{}_yN_z$ film is $M^2$.

In some embodiments the $M^1$-precursor comprises Ti, Ta, Nb, Mo or W. In some embodiments the $M^1$ precursor is a halide, such as a chloride of Ti, Ta, Nb, Mo or W. In some embodiments the $M^1$-precursor is metal-organic precursor.

In some embodiments the nitrogen-precursor can be selected from the group consisting of ammonia, $N_2H_4$, nitrogen atoms, nitrogen containing plasma or nitrogen radicals.

In some embodiments the $M^2$-precursor comprises Mo or W. In some embodiments the $M^2$ precursor is a halide, such as a fluoride of Mo or W, like $MoF_x$ or $WF_6$. In some embodiments the $M^2$-precursor is a metal-organic precursor.

In some embodiments $M^1$ is different from $M^2$.

In some embodiments the second reactant can be selected from the group consisting of boranes or silanes, such as diborane or disilane.

In some embodiments a thermal ALD process is used for depositing a $M^1{}_xM^2{}_yN_z$ film and the N-precursor is ammonia or $N_2H_4$. In some embodiments a plasma ALD process is used and the N-precursor for depositing a $M^1{}_xM^2{}_yN_z$ film comprises nitrogen atoms, nitrogen containing plasma or nitrogen radicals.

Specific process conditions and parameters are provided below for deposition of exemplary $Ti_xW_yN_z$ films. The process conditions described with respect to these processes can be applied to the deposition of other $M^1{}_xM^2{}_yN_z$ films.

In some embodiments the ratio of metal nitride sub-cycles to elemental metal sub-cycles is selected to deposit a film that closes at very thin thicknesses, such as less than about 3 nm (where closed means that atoms of the underlying substrate are not detected at the outermost surface anymore, as determined, for example, by LEIS). In some embodiments the ratio of sub-cycles is selected such that the film is electrically continuous i.e. conducts current at very thin thicknesses, such as less than about 3 nm, less than about 2 nm, less than about 1.5 nm or even less than about 1.0 nm. In some embodiments the ratio of sub-cycles is selected such that the film is continuous as a layer, but may contain some non-continuous features, such as holes, in the continuous matrix at very thin thicknesses, such as less than about 3 nm, less than about 2 nm, less than about 1.5 nm or even less than about 1.0 nm. In some embodiments the ratio of sub-cycles is selected such that the film is not closed and may not be continuous, but still acts as a diffusion barrier at very thin thicknesses, such as less than about 3 nm, less than about 2 nm, less than about 1.5 nm or even less than about 1.0 nm.

In some embodiments a pulsing ratio of 5 or greater, 10 or greater or 20 or greater, such as 20 to 30, is selected to deposit a film that closes, is electrically conductive, continuous as a layer, or acts as a diffusion barrier quickly, as explained above. In some embodiments a pulsing ratio of about 20 is selected to deposit a film that closes at about 2 nm thickness.

In some embodiments a $M^1{}_xM^2{}_yN_z$ film is deposited with an RMS roughness below about 2 nm, below about 1.5 nm, below about 1.0 nm, or even below about 0.7 nm, where the thickness is from about 20 to about 50 nm. However, in some embodiments the RMS roughness is below about 0.5 nm, below about 0.4 nm or even below about 0.3 nm for films with a thickness of less than about 10 nm. RMS roughness can be measured, for example, by x-ray reflectivity (XRR).

$Ti_xW_yN_z$ Film Deposition by ALD

As mentioned above, an atomic layer deposition process may comprise multiple super-cycles, where each super-cycle comprises at least one TiN sub-cycle and at least one W sub-cycle. In some embodiments, each deposition sub-cycle comprises alternately and sequentially contacting the substrate with a metal precursor and second precursor. The ratio of the TiN and W sub-cycles can be varied to achieve the desired composition, and the number of super-cycles can be selected to deposit a titanium nitride film of the desired thickness. The number of each sub-cycle in a super-cycle is limited such that a mixed $Ti_xW_yN_z$ film is formed, and distinct TiN and W layers are not visible. In some embodiments the maximum number of consecutive TiN sub-cycles in a super-cycle is about 30 to about 60, about 30 to about 50 or about 40. In a process using $TiCl_4$ and $NH_3$, as described below, the maximum number is about 40 in some embodiments. The maximum number of consecutive W sub-cycles in a super-cycle is about 3 to about 10, about 3 to about 6, or about 5 in some embodiments.

The super-cycle can be written as:

a[b(titanium precursor+nitrogen reactant)+c(second reactant+tungsten precursor)], where (titanium precursor+nitrogen reactant) represents a TiN sub-cycle and b is the number of TiN sub-cycles in each super-cycle, (second reactant+tungsten precursor) represents a tungsten sub-cycle and c is the number of W sub-cycles in each super-cycle and a is the number of super-cycles. Although illustrated with the TiN sub-cycle coming first in the super-cycle, in some embodiments in one or more super-cycles the tungsten sub-cycle comes first. Thus in some embodiments the TiN sub-cycle can be considered the first sub-cycle and the tungsten sub-cycle can be considered the second sub-cycle, while in some embodiments the tungsten sub-cycle can be considered the first sub-cycle and the TiN sub-cycle can be considered the second sub-cycle.

In some embodiments the titanium precursor can be a titanium halide, such as $TiCl_4$. In some embodiments the titanium precursor can be a metal-organic precursor. In some embodiments the nitrogen reactant can be selected from the group consisting of ammonia, $N_2H_4$, nitrogen atoms, nitrogen containing plasma and nitrogen radicals. In some embodiments the second reactant can be a borane or silane, such as diborane or disilane. In some embodiments the tungsten reactant can be a tungsten halide, such as $WF_6$.

In some embodiments a super-cycle can be written as a[b($TiCl_4+NH_3$)+c($Si_2H_6+WF_6$)], where b is the number of TiN sub-cycles in each super-cycle, c is the number of W sub-cycles in each super-cycle and a is the number of super-cycles.

The ratio of TiN to W sub-cycles can thus be given as b:c (or TiN:W). In some embodiments the ratio of sub-cycles is constant in each ALD super-cycle in the ALD process. In other embodiments the ratio of sub-cycles may be changed in one or more super-cycle. Unless indicated otherwise, when a ratio of sub-cycles is provided herein, it refers to the ratio of sub-cycles in a one or more specific super-cycles, rather than the ratio of total sub-cycles in a complete ALD process comprising multiple super-cycles.

In some embodiments the first and second deposition sub-cycles are performed at same reaction temperature. In some embodiments the deposition temperature for one or both of the TiN and W sub-cycles is about 100 to about 700° C., about 200 to about 500° C., about 250 to about 400° C., or about 325 to about 375° C. In some embodiments both the TiN and W sub-cycles are carried out at about 350° C.

In some embodiments, the first and second deposition sub-cycles are performed in the same reactor.

The first and second deposition sub-cycles may be provided at a selected ratio to deposit a thin film with a desired composition and desired properties. For example, in some embodiments the ratio of the first, TiN deposition sub-cycle to the second W deposition sub-cycle in one or more ALD super-cycles may be from about 0.1 to about 100, about 0.25 to about 50 or about 0.5 to about 40. In some embodiments the ratio of TiN deposition sub-cycles to W sub-cycles in one or more super-cycles is less than one. In some embodiments the ratio of TiN deposition sub-cycles to W sub-cycles in one or more super-cycles is between about 1 and about 3. In some embodiments the ratio of TiN deposition sub-cycles to W sub-cycles in one or more super-cycles is between about 1 and about 50, between about 3 and about 30 or between about 5 and about 20. In some embodiments the ratio of TiN deposition sub-cycles to W sub-cycles in one or more super-cycles is about 0.5, about 1, about 3, about 5, about 10, about 20, about 40 or about 50.

As mentioned above, the ratio of sub-cycles can be selected to achieve a desired composition and desired film properties. For example, in some embodiments the ratio of TiN to W deposition sub-cycles is increased to increase the density of the film, or decreased to decrease the density of the deposited film.

In some embodiments the ratio of TiN to W deposition sub-cycles is increased to increase the resistivity of the deposited film, or decreased to decrease the resistivity.

In some embodiments, a smooth $Ti_xW_yN_z$ film that does not have a columnar grain structure is deposited. In some embodiments the ratio of TiN deposition sub-cycles to W sub-cycles is selected to be less than or equal to one and a $Ti_xW_yN_z$ film nanocrystalline film that does not have a columnar grain structure is formed. In some embodiments when a ratio of less than one is used, the $Ti_xW_yN_z$ film may be essentially $W_yN_z$ film, where the amount of Ti is approximately 0 at-%.

In some embodiments, the ratio of TiN deposition sub-cycles to W sub-cycles is selected to be between about 3 and about 20 in order to deposit a $Ti_xW_yN_z$ film comprising a solid solution of $(W,Ti)_2N$ that does not have a columnar grain structure.

In some embodiments, the ratio of TiN deposition sub-cycles to W sub-cycles is selected to be greater than about 30 in order to deposit a $Ti_xW_yN_z$ film comprising a solid solution of $(Ti,W)N$ that does not have a columnar grain structure.

In some embodiments the ratio of TiN sub-cycles to W sub-cycles is selected to deposit a film that closes at very thin thicknesses, such as less than about 3 nm. In some embodiments the ratio of sub-cycles is selected such that the film is electrically continuous i.e. conducts current at very thin thicknesses, such as less than about 3 nm, less than about 2 nm, less than about 1.5 nm or even less than about 1.0 nm. In some embodiments the ratio of sub-cycles is selected such that the film is continuous as a layer, but may contain some non-continuous features, such as holes, in the continuous matrix at very thin thicknesses, such as less than about 3 nm, less than about 2 nm, less than about 1.5 nm or even less than about 1.0 nm. In some embodiments the ratio of sub-cycles is selected such that the film is not closed and may not be continuous, but still acts as a diffusion barrier at very thin thicknesses, such as less than about 3 nm, less than about 2 nm, less than about 1.5 nm or even less than about 1.0 nm.

In some embodiments a pulsing ratio of 5 or greater, 10 or greater or 20 or greater, such as 20 to 30, is selected to deposit a film that closes, is electrically conductive, continuous as a layer, or acts as a diffusion barrier quickly, as explained above. In some embodiments a pulsing ratio of about 20 is selected to deposit a film that closes at about 2 nm thickness.

In some embodiments the ratio of first TiN deposition sub-cycles to second W deposition sub-cycles is the same in all of the complete ALD super-cycles performed in the ALD process. In other embodiments the specific ratio of first TiN deposition sub-cycles to second W deposition sub-cycles can be varied in different complete ALD super-cycles. The specific ratios can be selected by the skilled artisan to provide the desired amounts of titanium, nitrogen and tungsten in the film and thus to achieve a film with the desired properties.

In some embodiments, the ultimate $Ti_xW_yN_z$ film that is formed will comprise more titanium than tungsten. In some embodiments at least 30%, at least 50%, at least 80%, at least 90%, at least 95%, at least 98%, at least 99% or at least 99.5% of the metal in the $Ti_xW_yN_z$ film is tungsten. In some embodiments less than 70%, less than 40%, less than 30%, less than 20%, less than 5%, less than 3%, less than 1% or less than 0.5% of the metal in the $Ti_xW_yN_z$ film is tungsten.

In some embodiments, as illustrated in FIG. 1, an ALD process for forming a $Ti_xW_yN_z$ film on a substrate in a reaction chamber comprises multiple ALD super-cycles 100. Each super-cycle comprises a first TiN deposition sub-cycle 200 and a second W deposition sub-cycle 300. The super-cycle 100 is repeated as many times as desired to deposit a $Ti_xW_yN_z$ film of the desired thickness. The ratio of the sub-cycles 200, 300 within the super-cycle 100 may be selected to achieve a film with the desired composition and properties.

The first titanium nitride deposition sub-cycle comprises:
pulsing a vaporized first titanium precursor, such as $TiCl_4$ into the reaction chamber 210 to form at most a molecular monolayer of titanium precursor on the substrate,
purging the reaction chamber 220 to remove excess titanium precursor and reaction by products, if any,
providing a pulse of a nitrogen reactant, such as $NH_3$, into the reaction chamber 230, where the nitrogen source contacts and reacts with the titanium precursor on the substrate to form titanium nitride,
purging the reaction chamber 240 to remove excess nitrogen source and any gaseous by-products formed in the reaction between the titanium precursor layer on the first surface of the substrate and the nitrogen reactant, and
repeating 250 the pulsing and purging steps.

In some embodiments, the first deposition sub-cycle is repeated 1, 2, 3, 4, 5, 10, 20, 50, 100 or more times in succession. In some embodiments the first deposition sub-cycle is repeated no more than about 30-60 times consecutively, up to about 30 to 50 times consecutively, or up to about 40 times consecutively.

The atomic layer deposition super-cycle 100 for forming the $Ti_xW_yN_z$ film also comprises one or more second tungsten deposition sub-cycles 300. In some embodiments, the second tungsten deposition sub-cycle 300 comprises:

pulsing a vaporized tungsten precursor, such as $WF_6$ into the reaction chamber 310 to form at most a molecular monolayer of tungsten precursor on the substrate, purging the reaction chamber 320 to remove excess tungsten precursor and reaction by products, if any, providing a pulse of a second reactant, such as $Si_2H_6$, into the reaction chamber 330, where the second reactant reacts with the tungsten precursor on the substrate to form elemental tungsten, purging the reaction chamber 340 to remove excess second reactant and any gaseous by-products formed in the reaction between the tungsten precursor layer on the surface of the substrate and the second reactant, and repeating 350 the pulsing and purging steps.

In some embodiments, the second deposition sub-cycle 300 is repeated 1, 2, 3, 4, 5, 10, 20, 50, 100 or more times in succession. In some embodiments the second deposition sub-cycle is repeated about 3 to 6 times, or about 5 times.

Other methods for depositing tungsten are described in U.S. Pat. No. 6,475,276, which is incorporated by reference herein.

The first and second deposition sub-cycles 200,300 are repeated multiple times in a complete ALD super-cycle 100, and the complete ALD super-cycle 100 is repeated to form a $Ti_xW_yN_z$ film of a desired thickness comprising a desired concentration of titanium, nitrogen and tungsten.

In some embodiments, the number of times the first deposition sub-cycle 200 and second deposition sub-cycle 300 are repeated is the same in each complete ALD super-cycle 100. In other embodiments, the number of first and second deposition sub-cycles 100, 200 varies in one or more complete ALD super-cycles 100. The number of first and second sub-cycles 100, 200 in each complete ALD super-cycle 100 and the total number of first and second sub-cycles 100, 200 and total ALD super-cycles 100 can be adjusted to achieve deposition of a $Ti_xW_yN_z$ film of a desired thickness and composition.

In some embodiments, each first and/or second deposition sub-cycle forms at most a monolayer of titanium nitride and tungsten respectively.

Although illustrated as beginning with the first deposition sub-cycle 200, each complete ALD cycle may begin and end with either the first 100 or second 200 deposition sub-cycle. For example, each ALD super-cycle for forming the $Ti_xW_yN_z$ film can be started with the first titanium nitride deposition sub-cycle or the tungsten deposition sub-cycle. In some embodiments one or more super-cycles may begin with the tungsten sub-cycle.

In some embodiments the titanium reactant in the titanium nitride deposition sub-cycle is a titanium halide, such as $TiCl_4$ and the nitrogen reactant is $NH_3$.

In some embodiments the tungsten reactant in the tungsten deposition sub-cycle is a tungsten halide, such as $WF_6$ and the second reactant is a silane or borane, such as $Si_2H_6$.

The precursors employed in the processes may be solid, liquid or gaseous material under standard conditions (room temperature and atmospheric pressure), provided that the metal precursor is in vapor phase before it is conducted into the reaction chamber and contacted with the substrate surface. S "Pulsing" a vaporized reactant onto the substrate means that the vapor is conducted into the chamber for a limited period of time. Typically, the pulsing time is from about 0.05 to 10 seconds. However, depending on the substrate type and its surface area, the pulsing time may be even higher than 10 seconds.

As an example, for a 300 mm wafer in a single wafer ALD reactor, the precursors are typically pulsed for from about 0.05 to 10 seconds, more preferably for from about 0.1 to 5 seconds and most preferably for from about 0.3 to 3.0 seconds. However, pulsing times can be on the order of minutes in some cases. The optimum pulsing time can be readily determined by the skilled artisan based on the particular circumstances.

The mass flow rate of the metal precursor can be determined by the skilled artisan. In some embodiments, for example for deposition on 300 mm wafers, the flow rate of the reactants is preferably between about 1 and 1000 sccm, about 10 to about 800 sccm, or about 50 to about 500 sccm, without limitation.

The pulsing time and mass flow rate of each of the reactants can be selected independently. In some embodiments the pulsing time (and/or mass flow rates) of two or more of the reactants is the same, while in some embodiments the pulsing times (or mass flow rates) are different.

The pressure in the reaction chamber is typically from about 0.01 to 20 mbar, more preferably from about 1 to about 10 mbar. However, in some cases the pressure will be higher or lower than this range, as can be readily determined by the skilled artisan depending on multiple parameters, such as the particular reactor being used, the process and the precursors.

Before starting the deposition of the film, the substrate is typically heated to a suitable growth temperature, as discussed above. The preferred deposition temperature may vary depending on a number of factors such as, and without limitation, the reactant precursors, the pressure, flow rate, the arrangement of the reactor, and the composition of the substrate including the nature of the material to be deposited on. The specific growth temperature may be selected by the skilled artisan based on the particular circumstances.

The processing time depends, in part, on the thickness of the layer to be produced, the composition of the film, and the growth rate of the individual deposition sub-cycles and the overall growth rate.

In some embodiments the titanium nitride is deposited by ALD over a substrate surface to form a conformal thin film of between about 1 nm and about 200 nm, between about 1 nm and about 50 nm in thickness, between about 1 nm and about 30 nm, and in some cases between about 2 nm and about 10 nm. In some embodiments the thickness of the metal nitride layer is less than 10 nm, or less than 5 nm.

The present methods allow for the formation of completely closed layers at very low thicknesses. In some embodiments a metal nitride layer is formed that closes with a thickness of about 3 nm or less, or a thickness of about 2 nm or less, as described above.

In an exemplary embodiment, an ALD sub-cycle for depositing titanium nitride comprises alternatingly and sequentially contacting the substrate with a Ti precursor such as $TiCl_4$ and a nitrogen reactant such as ammonia. An ALD sub-cycle for forming tungsten comprises alternatingly and sequentially contacting the substrate with a tungsten precursor, such as $WF_6$ and a second reactant such as $Si_2H_6$.

In some embodiments, the $Ti_xW_yN_z$ film is deposited conformally over vertical and horizontal surfaces.

In some embodiments a $Ti_xW_yN_z$ film is deposited with an RMS roughness below about 2 nm, below about 1.5 nm, below about 1.0 nm, or even below about 0.7 nm, where the thickness is from about 20 to about 50 nm. However, in some embodiments the RMS roughness is below about 0.5 nm, below about 0.4 nm or even below about 0.3 nm for films with a thickness of less than about 10 nm. RMS roughness can be measured, for example, by XRR.

In some embodiments a $Ti_xW_yN_z$ film comprising $Ti_{0.26}W_{0.33}N_{0.41}$ is deposited. Such a film may be deposited, for example, by utilizing a ratio of TiN to W sub-cycles of about 20:1.

In some embodiments a $Ti_xW_yN_z$ film that does not have a columnar grain structure is deposited.

In some embodiments, a $Ti_xW_yN_z$ film with a nanocrystalline grain size is deposited.

It will be apparent to the skilled artisan that the above described processes and films will be beneficial at any of a number of integrated circuit fabrication steps and will find use in a wide variety of contexts. In some embodiment, a $Ti_xW_yN_z$ film deposited by the methods provided herein is used as a gate electrode, an electrode for a memory device, a phase-change memory, such as GST, a heater material, a capacitor electrode, such as a MIM, MIS or MIMIM electrode and the like, a diffusion barrier, such as a copper diffusion barrier or a contact plug.

Various modifications, omissions and additions may be made to the methods and structures described above without departing from the scope of the invention. All such modifications and changes are intended to fall within the scope of the invention, as defined by the appended claims.

Examples $Ti_xW_yN_z$ films were deposited by ALD in a Pulsar® 2000 R&D reactor. The films were deposited with a super-cycle method using the following basic binary chemistries for TiN and W: $z[x(TiCl_4+NH_3)+y(Si_2H_6+WF_6)]$. The reactor temperature was 350° C. The steady state flow rates for $Si_2H_6$ and $WF_6$ were 100 sccm, and 240 sccm for $NH_3$. $TiCl_4$ was filled in the liquid source, which was in vapor push mode at room temperature (21° C.) and used $N_2$ as the carrier gas.

The basic process parameters were: $TiCl_4$; 50 ms pulse/5 s purge, $NH_3$; 10 s pulse/5 s purge, $Si_2H_6$; 0.5 pulse/5 s purge and $WF_6$; 0.5 s pulse/5 s purge.

The films were deposited on 200 mm, 20 nm TiN/20 nm $SiO_2$/Si and 20 nm $SiO_2$/Si wafers and on 2 nm $HfO_2$/Si planar wafer pieces (≈10×10 cm) or on patterned native $SiO_2$/Si (≈5×5 cm) pieces for conformality. The pieces were placed on 200 mm adapter wafers during the deposition runs. Film compositions were altered by changing the TiN/W cycle ratio (x/y) and film thicknesses were controlled by the number of super-cycles (z).

The films were characterized by four point probe measurements with CDE Resmap 168 for sheet resistance, x-ray reflectivity (XRR) with Brüker D8 Advance for thickness, roughness and density, by x-ray photoelectron spectroscopy (XPS) with PHI Quantum 2000 using monochromated $AlK_\alpha$ for composition (analysis done by EAG labs, East Windsor, N.J.), by secondary electron microscope (SEM) with Hitachi S-4800 field emission scanning electron microscope for morphology and conformality and by heated stage x-ray diffraction (XRD) with PANalytical X'Pert Pro MPD X-ray diffractometer with $CuK_\alpha$ radiation and HTK 1200 Anton Paar oven in nitrogen and air atmospheres for crystallographic phase evolution as a function of annealing temperature.

Table 1 summarizes the composition, resistivity, roughness, density and growth rates of the TiN/W mixed process with different TiN/W cycle ratios.

TABLE 1

Properties of the ALD $Ti_xW_yN_z$ layers. The compositions reported in the table are the compositions of the films measured by XPS after sputtering with 2 keV $Ar^+$ ions until the surface carbon contamination in the signals was absent.

| TiN/W cycle ratio | TiN/(TiN + W) cycle ratio | Layer Roughness, nm (RMS, XRR) | Layer Density, g/cm³ (XRR) | Layer Resistivity, μΩcm | GR, Å/sub-cycle | N, at.-% | O, at.-% | F, at.-% | Si, at.-% | Ti, at.-% | W, at.-% |
|---|---|---|---|---|---|---|---|---|---|---|---|
| W | 0 | 4.15 | 17.3 | 122.2 | 6.26 | 0.5 | 1.3 | 0.3 | 3.0 | 0.1 | 94.8 |
| 0.5 | 0.33 | 2.14 | 16.5 | 187.8 | 2.24 | 8.5 | 0.5 | 0.3 | 2.0 | 0.0 | 88.7 |
| 1 | 0.50 | 0.65 | 16.1 | 173.6 | 0.78 | 9.6 | 0.7 | 0.0 | 0.9 | 0.1 | 88.7 |
| 3 | 0.75 | 1.15 | 12.5 | 622.3 | 0.77 | 21.0 | 0.6 | 3.0 | 1.0 | 3.1 | 71.4 |
| 5 | 0.83 | 1.96 | 11.9 | 711.4 | 0.63 | 25.7 | 0.4 | 3.0 | 1.2 | 7.2 | 62.4 |
| 20 | 0.95 | 1.01 | 8.6 | 553.7 | 0.33 | 39.9 | 0.3 | 2.3 | 0.5 | 24.9 | 32.0 |
| 40 | 0.98 | 0.65 | 7.8 | 381.6 | 0.30 | 44.0 | 0.6 | 1.6 | 0.8 | 32.2 | 20.8 |
| TiN | 1 | 2.74 | 5.3 | 143.1 | 0.24 | 53.2 | 0.8 | 0.0 | 0.2 | 45.7 | 0.0 |

Pure W films grew with a high growth rate of 6 Å/cycle, comparable to the growth rates reported in the literature on $Al_2O_3$. However, the roughness of the W film was also very high. Adding some TiN cycles in between the W cycles decreased the growth rate of the films and at the same time the roughness of the film was reduced substantially. Surprisingly though, the films did not contain any titanium when the TiN/W cycle ratio was ≤1. Instead, the resultant film was $W_xN_y$ with less than 10 at-% nitrogen and some silicon impurity. This may indicate that the TiN cycles in between the W cycles modified the nucleation behavior of W and resulted in lower growth rates and smoother films.

When the TiN/W cycle ratio was increased to ≥3, the films started to show a further increase in nitrogen content and a slow increase in titanium content with an increasing TiN/W cycle ratio. This suggested that when an adequate amount of TiN cycles was done before the W cycle, the $Si_2H_6$ and $WF_6$ was not able to remove all the titanium from the surface and therefore the titanium content of the films gradually started to increase.

The resistivity of the films first increased with increasing nitrogen content when the titanium content of the film was low, and then started to decrease again when the titanium content of the films was more than ≈20 at-%.

Figure 2A:
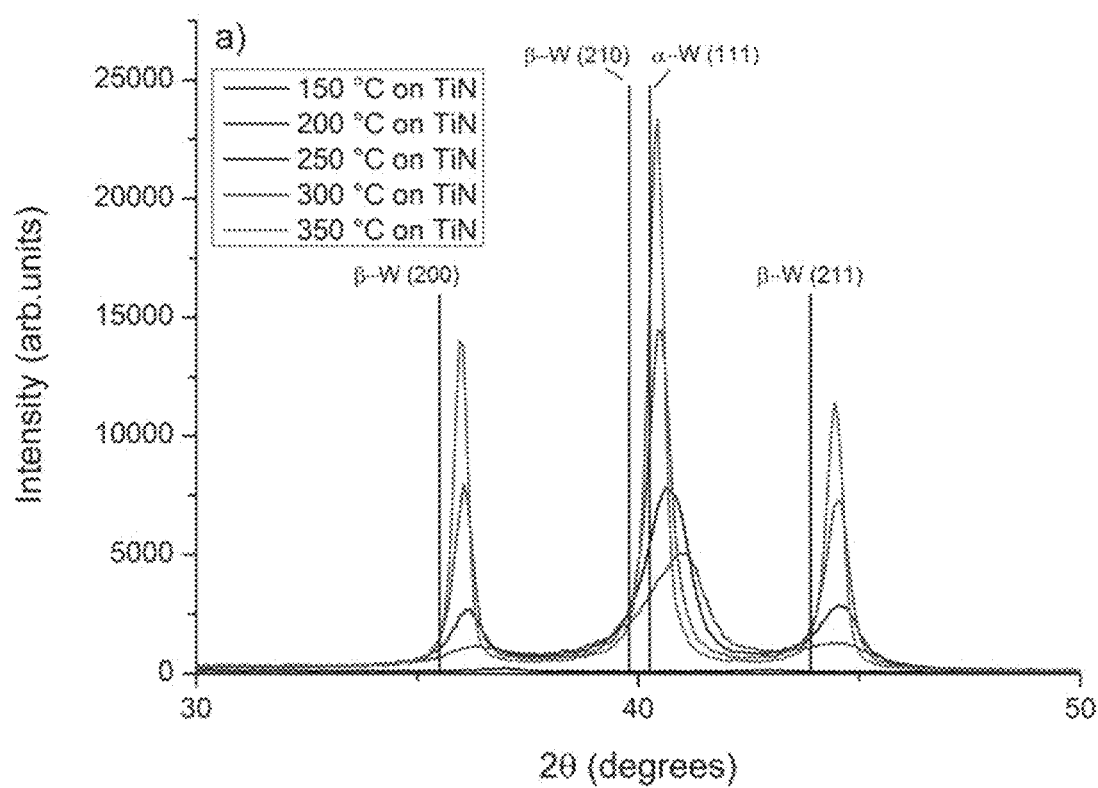
FIGS. 2A-C show XRD patterns of 100 cycles of pure ALD-W films deposited on TiN (FIG. 2A), $SiO_2$ (FIG. 2B) and $HfO_2$ (FIG. 2C) surfaces.
Figure 2B:
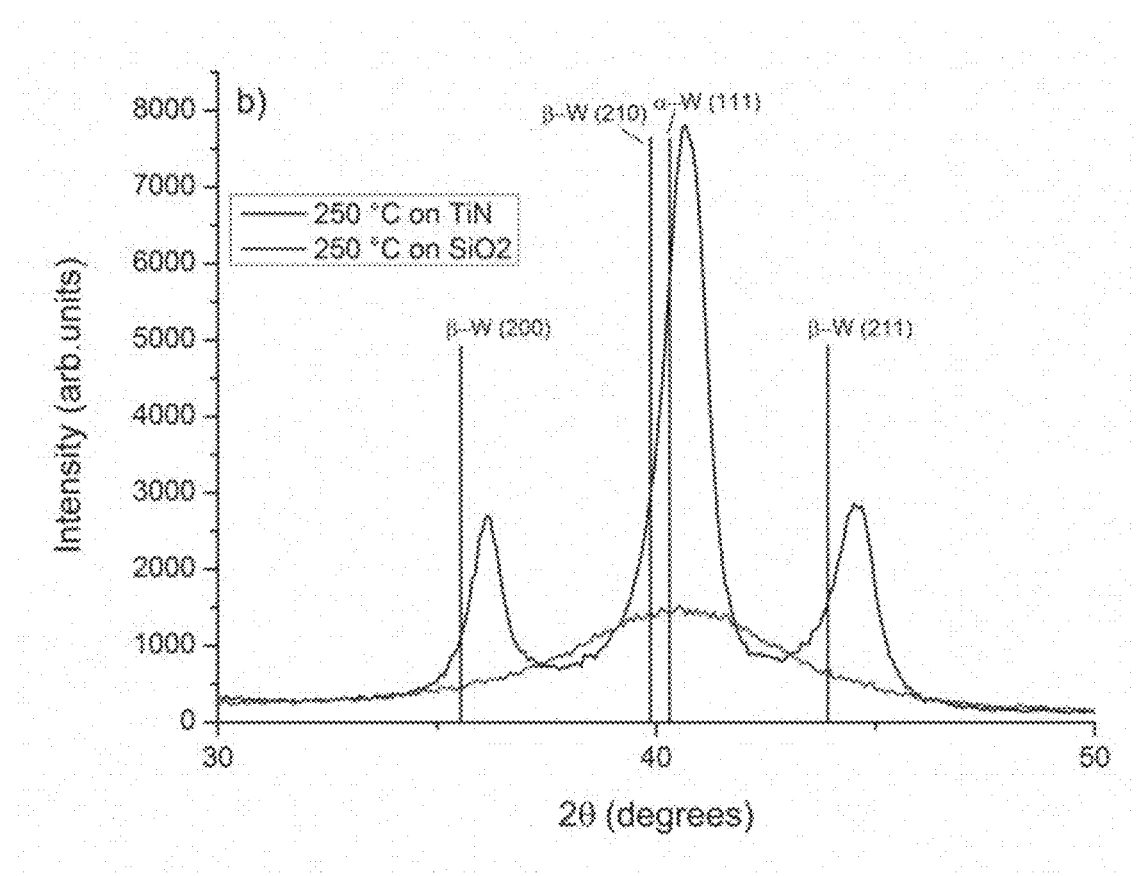
Figure 2C:
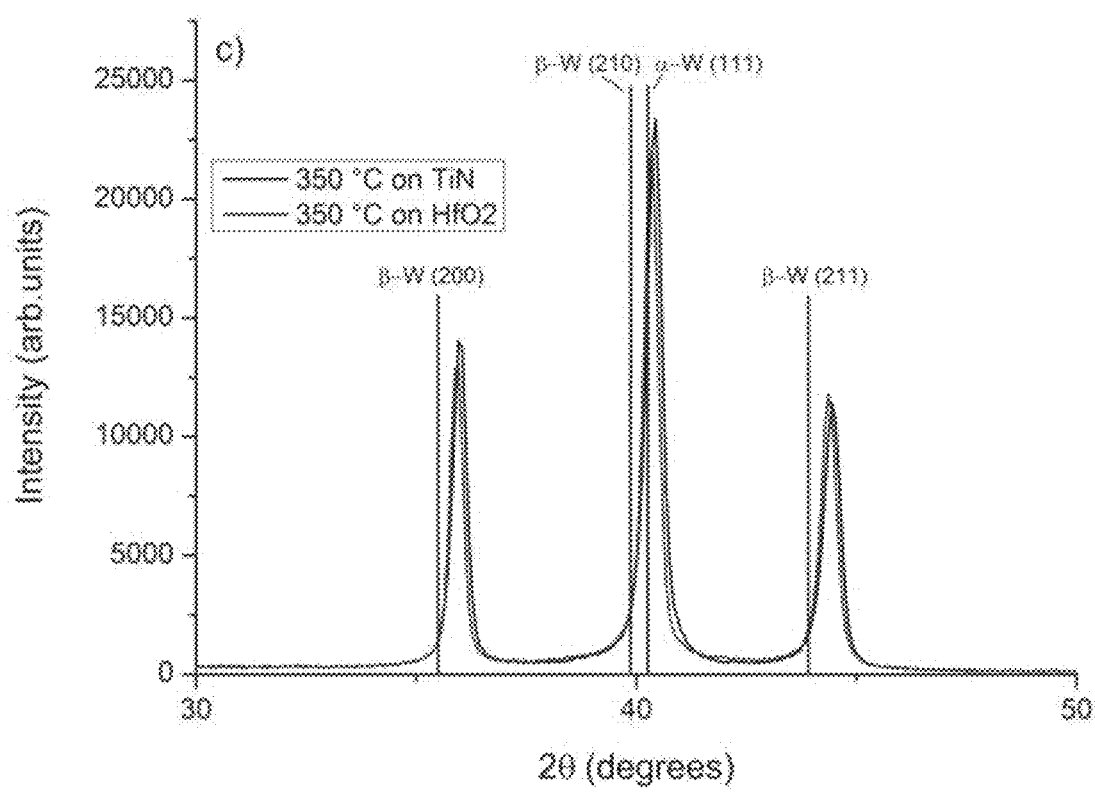

The crystallographic phases of the films were studied by x-ray diffraction analysis. Pure W films showed β-W crystal structure. The stabilization of the metastable β-W phase for the pure ALD tungsten has not been reported before. In order to determine whether the β-W stabilization is a general result of the ALD W process itself, or if it was stabilized by the $HfO_2$ substrate, the pure W process was also run on TiN and $SiO_2$ substrates. These results are presented in FIGS. 2A-C, which show XRD patterns of 100 cycles of pure ALD-W films deposited on TiN (FIG. 2A), $SiO_2$ (FIG. 2B) and $HfO_2$ (FIG. 2C) surfaces. The XRD peak shifts to higher 2θ-values indicate that the films have residual tensile stress in all cases. The peak intensity increase in FIG. 2A is caused mainly by the increased grain size with higher deposition temperature and partly because of the higher growth rate with higher deposition temperature. At 150° C. there were no film growth on the TiN surface The TiN substrate was found to promote the stabilization of β-W crystal structure, whereas on $SiO_2$ substrates the resultant film seemed to be α-W with small crystallite size, as indicated by the wide XRD 2θ peak at ≈40°. In all cases, the XRD 2θ peaks were shifted to higher 2θ values compared to the powder diffraction reference values, indicating that the tungsten film had tensile residual stress on all the surfaces. However, the shift was greater for the β-W on TiN and $HfO_2$ than for the α-W on $SiO_2$. The α-W to β-W transition may also partly explain the higher ALD growth rates (≈6 Å/cycle) for W observed on TiN and $HfO_2$ and what has also been reported in the literature on $Al_2O_3$, compared to the growth rates reported on $SiO_2$ (≈3 Å/cycle). β-W has a lattice parameter of 5.05 Å, whereas for α-W it is 3.16 Å.

Figure 3A:
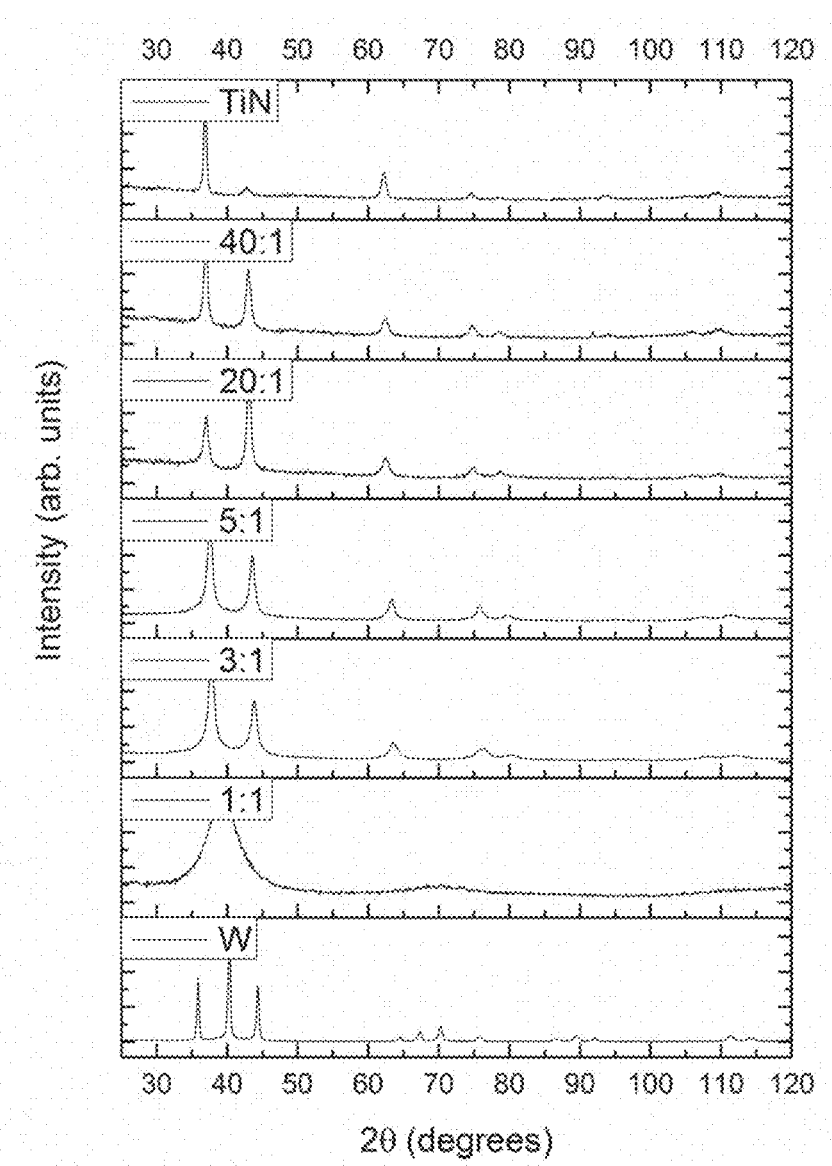
FIGS. 3A and B show XRD patterns of $Ti_xW_yN_z$ films deposited using different TiN/W cycle ratios.
Figure 3B:
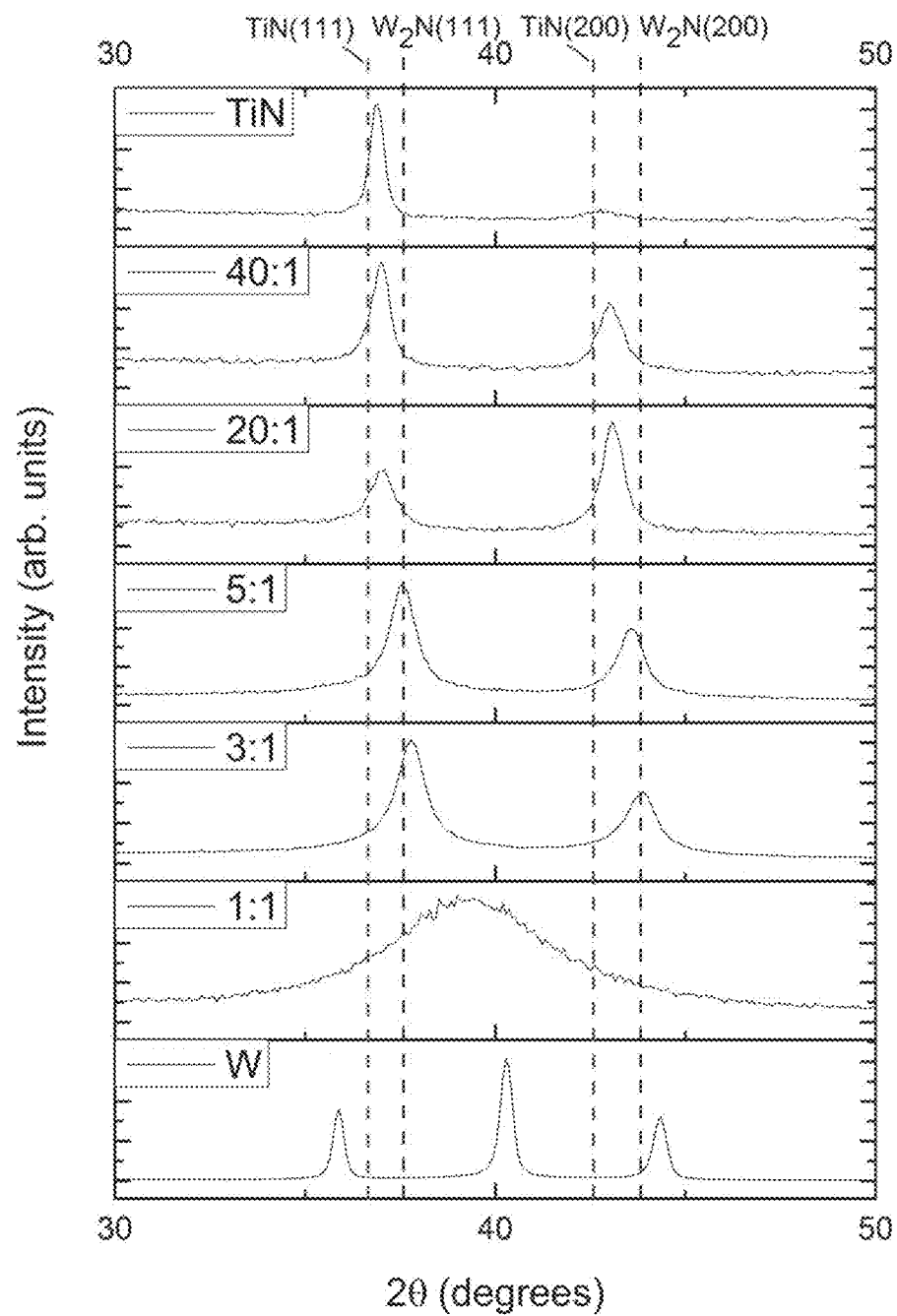

FIGS. 3A and B show the results for deposition of mixed $Ti_xW_yN_z$ films on $HfO_2$. With TiN/W cycle ratios of less than 3 the XRD analysis revealed two very wide peaks at 40 and 70°. These peaks could not be assigned to any of the compounds containing W and N in the XRD database; however their position matches the β-W peaks, so it is possible that these films still have the crystal structure of β-W, but have an extremely small crystallite size.

The $Ti_xW_yN_z$ films formed with TiN/W cycle ratios 3≤5 (Ti content 3≤7 at-%) adapted the crystal structure of $W_2N$ with tungsten atoms randomly displaced by titanium atoms in the lattice. For TiN/W cycle ratios between 3 and 5, the $W_2N$ peaks in the $Ti_xW_yN_z$ films were visible, but with 2 theta values shifted in between the $W_2N$ and TiN peaks. Also the intensity ratios of the XRD peaks changed with the composition of the $Ti_xW_yN_z$ layer. This type of behavior in the XRD pattern is typical for a solid solution.

With larger TiN/W cycle ratios the XRD peaks are shifted closer to the TiN peaks. In the case of the films deposited using TiN/W cycle ratios ≥20 (Ti content≥25 at-%), the films adapt the crystal structure of TiN with titanium atoms randomly displaced by tungsten atoms in the lattice.

Figure 4:
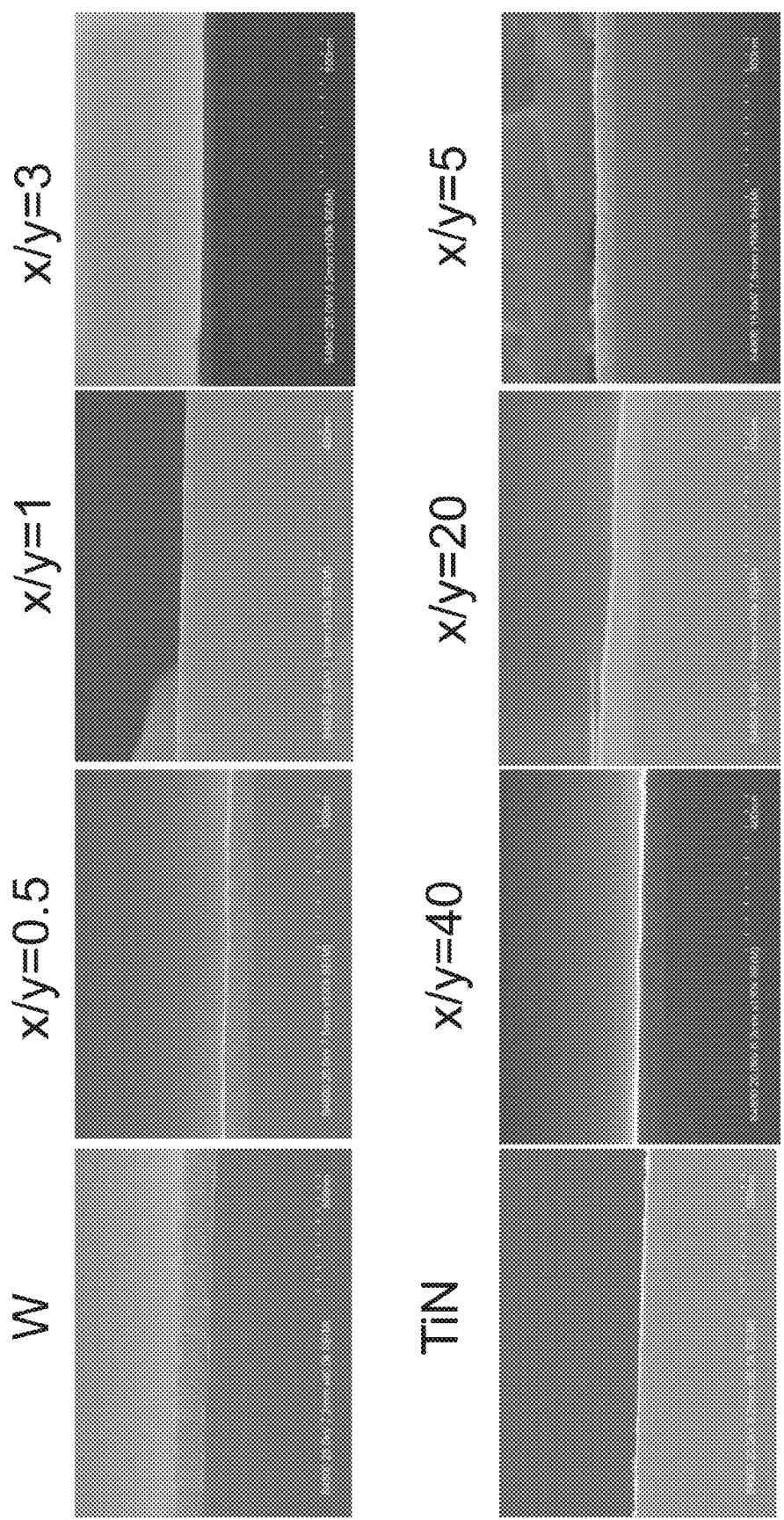
FIG. 4 shows a comparison of the morphology of $W_xN_y$ and $Ti_xW_yN_z$ layers deposited with various ratios of TiN to W deposition cycles, as well as pure W and TiN.

Both $W_xN_y$ and $Ti_xW_yN_z$ films exhibited substantially wider XRD peaks than pure W or TiN films with comparable thicknesses. The grain size estimated with the Debye-Scherrer method was ≈2 nm for $W_{0.9}N_{0.1}$ (1:1 TiN/W cycle ratio) and ≈20 nm for $Ti_{0.26}W_{0.33}N_{0.41}$ (20:1 TiN/W cycle ratio) film. FIG. 4 presents a comparison of the morphology of the $W_xN_y$ and $Ti_xW_yN_z$ layers deposited at various TiN:W sub-cycle ratios, along with pure W and TiN. The columnar grain structure clearly visible in pure W and TiN films is absent in the SEM images of the mixed process films. This confirms that the smooth film surfaces modeled in the XRR analysis and the wide peaks in the XRD patterns are a consequence of the nanocrystalline phase of the mixed process films with no visible grain morphology in the SEM analysis.

Figure 5:
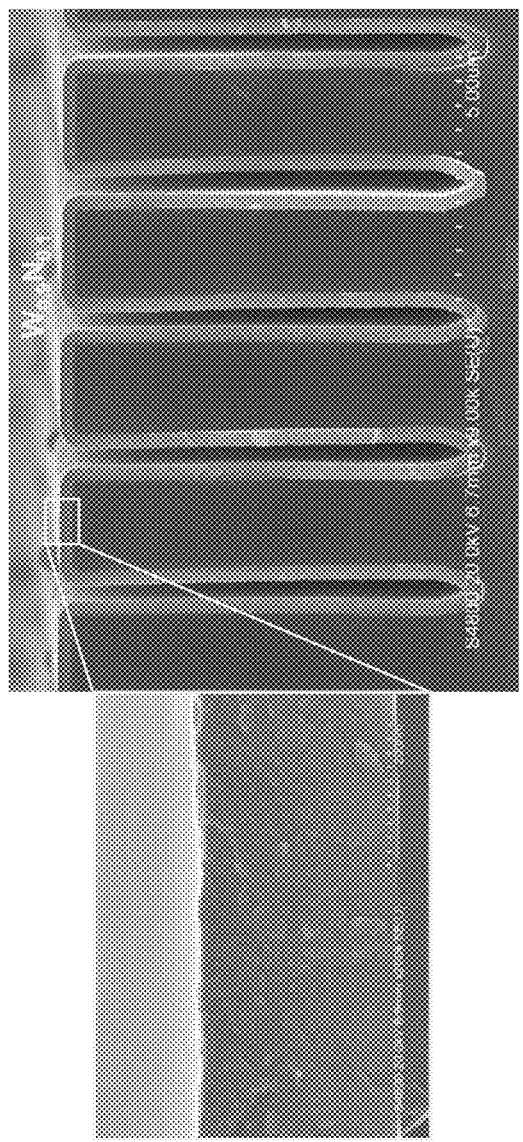
FIG. 5 shows SEM images of a $W_{0.9}N_{0.1}$ (TiN/W cycle ratio=1) film deposited in a 3D trench structure. The grain size was too small to be detected with SEM. The conformality and step coverage of the film appears to be excellent.

FIG. 5 presents a SEM image of a $W_{0.9}N_{0.1}$ (1:1 TiN/W cycle ratio) film in a 3D trench structure. The true ALD nature in the growth of the film is evident within the trench, showing constant film thickness inside the trench even though the trench width increased with its depth.

Figure 6A:
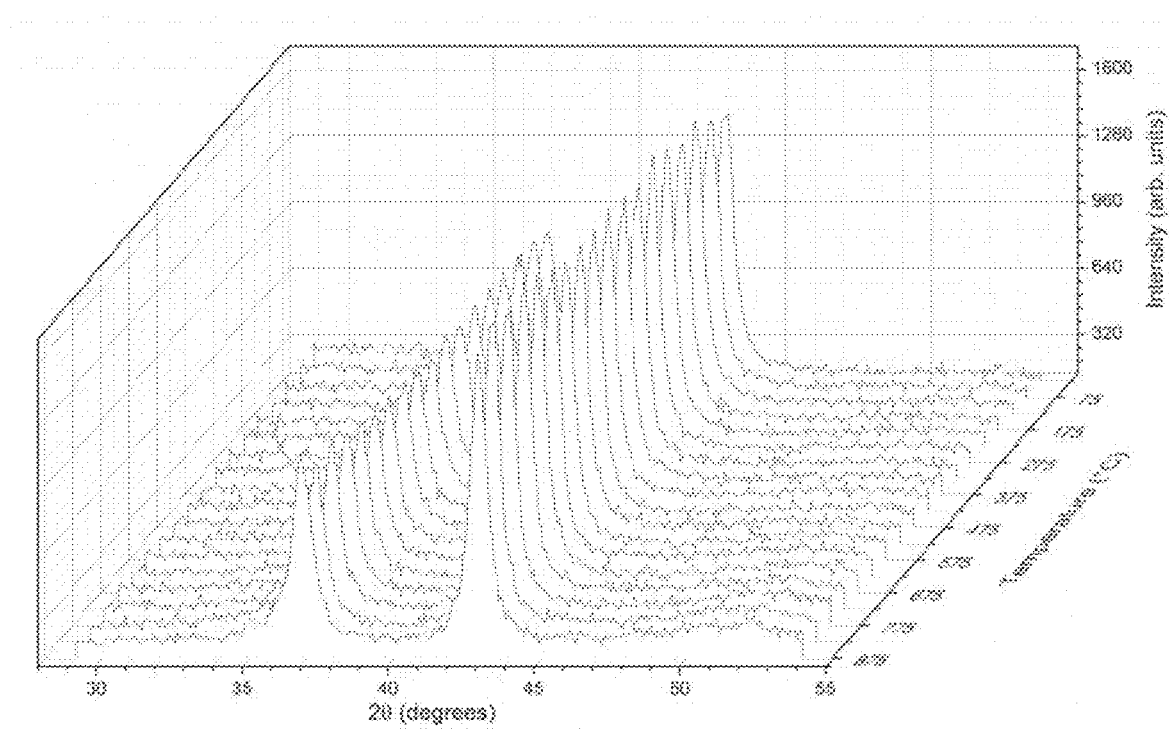
FIGS. 6A and B show heated stage XRD patterns of a $Ti_{0.26}W_{0.33}N_{0.41}$ (20:1 TiN/W cycle ratio) film in nitrogen atmosphere. No signs of grain coarsening with heating up to 875° C. are seen.
Figure 6B:
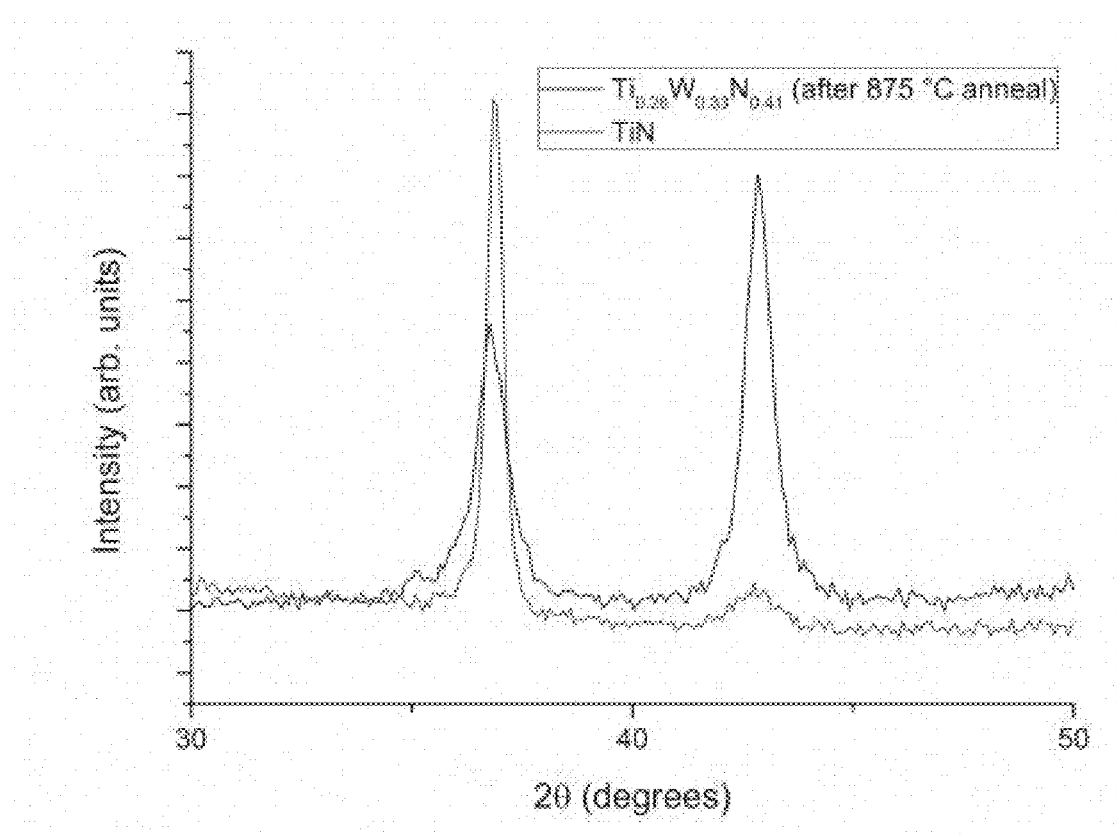
FIG. 6B shows a comparison with a pure TiN film having a similar thickness.

The stability and oxidation resistance of the nanocrystalline phase of a ternary $Ti_xW_yN_z$ film with a composition of $Ti_{0.26}W_{0.33}N_{0.41}$ (20:1 TiN/W cycle ratio) was studied by heated stage XRD. In nitrogen atmosphere the nanocrystalline phase was stable at up to 875° C. with no sign of grain coarsening during the heating cycles as shown in FIG. 6A. FIG. 6B shows a comparison with a pure TiN film with a similar thickness. FWHM was ≈0.7° for $Ti_{0.26}W_{0.33}N_{0.41}$ and ≈0.4° for TiN. This result suggests that the theoretically predicted high thermodynamic stability of the nanocrystalline phase in Ti—W alloys may be true also for the Ti—W—N system. Grain size estimated with the Debye-Sherrer method was about 20 nm for a 40 nm thick $Ti_{0.26}W_{0.33}N_{0.41}$ film.

Figure 7A:
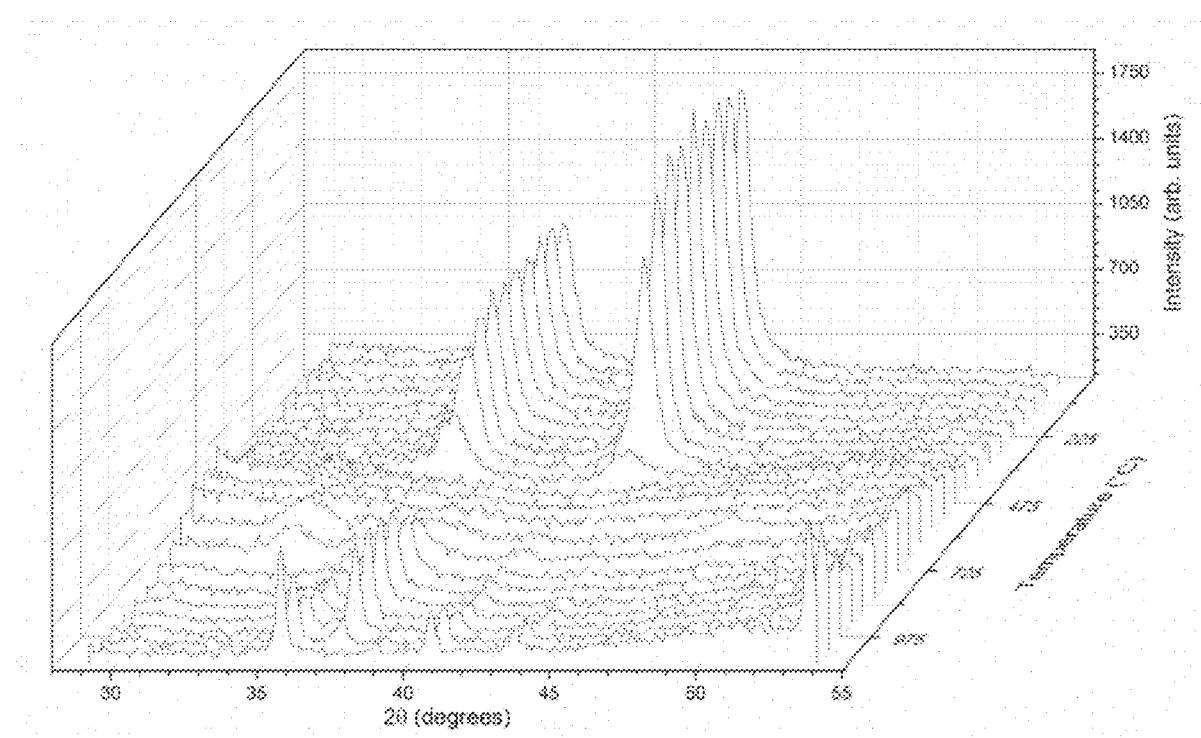
FIGS. 7A and B show heated stage XRD patterns of a $Ti_{0.26}W_{0.33}N_{0.41}$ (20:1 TiN/W cycle ratio) film in air atmosphere.
Figure 7B:
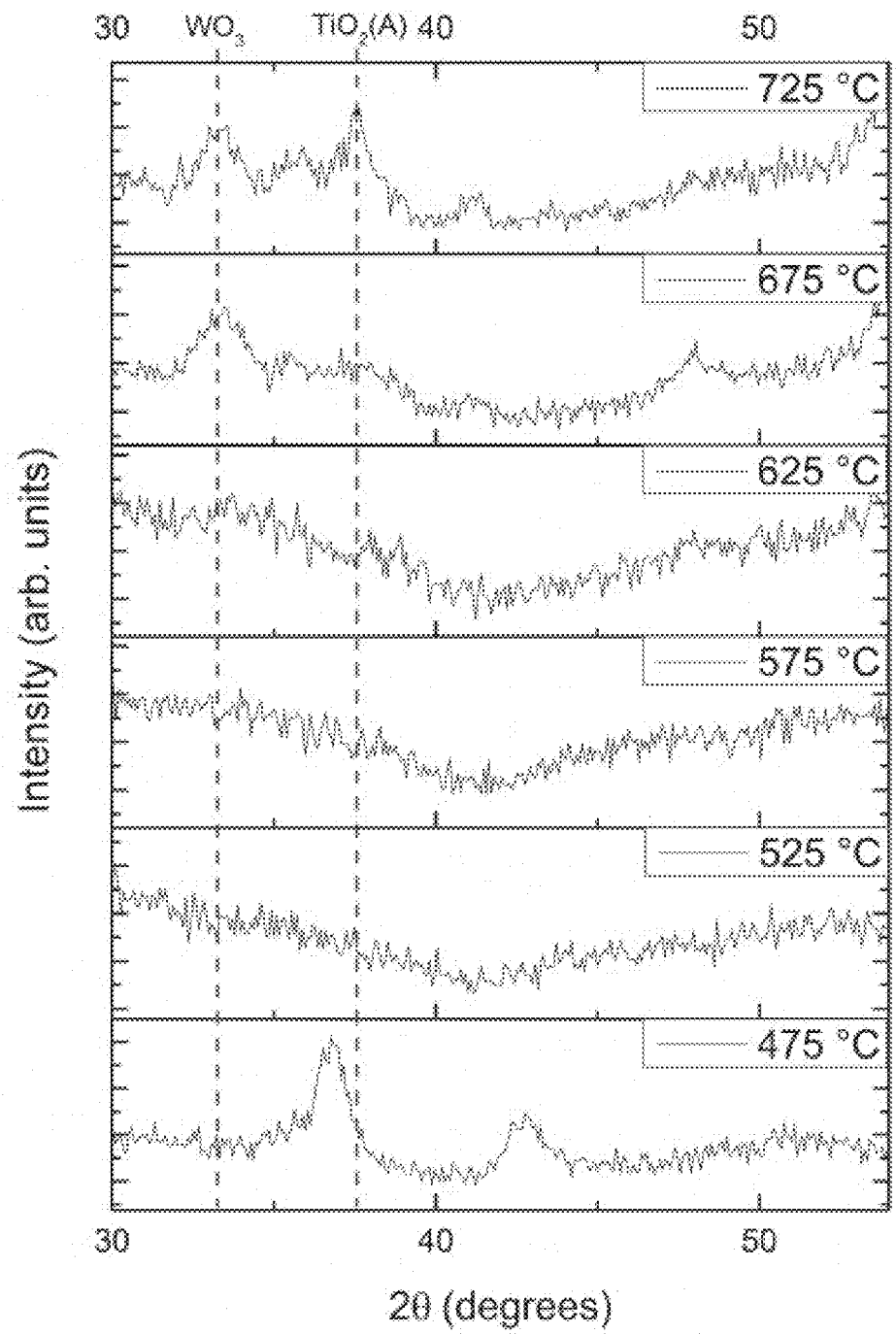

Results in an air atmosphere are presented in FIGS. 7A and B. The $Ti_{0.26}W_{0.33}N_{0.41}$ film started to oxidize around 500° C., first forming an amorphous oxide followed by the crystallization of $WO_3$ at 675° C., crystallization of $TiO_2$ anatase starting at 750° C. and finally a phase change from $TiO_2$ anatase to $TiO_2$ rutile starting at 850° C. The formation of an amorphous oxide in the beginning of the oxidation process is different from pure W or TiN oxidation, which oxidize directly to crystalline $WO_3$ or $TiO_2$. This is a further indication that the crystal size and structure of the $Ti_xW_yN_z$ is such that it does not promote any long range ordering in the formed oxides.

LEIS analysis showed that at a TiN/W sub-cycle pulsing ratio of about 20:1, the $Ti_xW_yN_z$ film seems to close at about 2 nm thickness (FIGS. 8A and B). The percentage of Ti in the film also increases more rapidly at a pulsing ratio of 20:1 relative to lower ratios (FIGS. 9A and B).

We claim:

1. An atomic layer deposition (ALD) process for depositing a metal nitride film on a substrate, the process comprising a plurality of super-cycles, each super-cycle comprising a TiN sub-cycle and a W sub-cycle,
   wherein the TiN sub-cycle comprises alternately and sequentially contacting the substrate with a titanium precursor and a nitrogen reactant;
   wherein the W sub-cycle comprises alternately and sequentially contacting the substrate with a tungsten precursor and a second precursor, wherein the second precursor is a silane or borane; and
   wherein the film comprises a mixed metal nitride.

2. The process of claim 1, wherein the titanium precursor is a titanium halide or metal-organic titanium compound and the tungsten precursor is a tungsten halide or metal-organic tungsten compound.

3. The process of claim 2, wherein the titanium precursor is $TiCl_4$ and the tungsten precursor is $WF_6$.

4. The process of claim 1, wherein the nitrogen reactant is selected from the group consisting of ammonia, $N_2H_4$, nitrogen atoms, nitrogen containing plasma and nitrogen radicals.

5. The process of claim 1, wherein the second precursor comprises disilane or trisilane.

6. The process of claim 1, wherein the TiN sub-cycle and the W sub-cycle are carried out at a ratio of at least about 3 in at least one of the plurality of super-cycles.

7. The method of claim 1, wherein the film forms a continuous layer.

8. A method for forming a film comprising a mixed metal nitride on a substrate in a reaction chamber, the method comprising:
   conducting an atomic layer deposition super-cycle comprising a metal nitride sub-cycle and an elemental metal sub-cycle,
   wherein the first metal nitride sub-cycle comprises:
      pulsing a first vapor-phase metal precursor comprising a first metal ($M^1$) into the reaction chamber to form at most a molecular monolayer of the metal precursor on the substrate; and
      pulsing a vapor phase nitrogen reactant into the reaction chamber, where the nitrogen reactant reacts with the metal precursor on the substrate to form a metal nitride; and wherein the second elemental metal sub-cycle comprises:

pulsing a second vapor phase metal precursor comprising a second different metal ($M^2$) into the reaction chamber to form at most a molecular monolayer of second metal precursor on the substrate; and pulsing a vapor phase second reactant into the reaction chamber that reacts with the second metal precursor to form elemental metal; and repeating the atomic layer deposition super-cycle to form a ternary metal nitride film of the desired thickness, the ternary metal nitride film having the formula $M^1_xM^2_yN_z$, wherein x is from 0 to 1.5, y is from 0.05 to 4 and z is from 0 to 2, and wherein each super-cycle comprises up to ten repetitions of the second elemental metal sub-cycle, and wherein a ratio of the first metal nitride sub-cycle to the second elemental metal sub-cycle in each super-cycle is 0.5 to 40.

9. The method of claim 8, wherein $M^1$ is selected from Ti, Ta, Nb, Mo and W and $M^2$ is selected from Mo and W.

10. The method of claim 8, wherein the first metal precursor comprises a metal halide or metal-organic compound.

11. The method of claim 8, wherein the second metal precursor comprises a metal halide or metal-organic compound.

12. The method of claim 8, wherein the second reactant comprises a silane or borane.

13. The method of claim 8, wherein the nitrogen reactant comprises ammonia, $N_2H_4$, nitrogen atoms, nitrogen containing plasma or nitrogen radicals.

14. The method of claim 8, wherein the metal nitride film does not have a columnar grain structure.

15. A method for forming a film comprising a mixed metal nitride on a substrate in a reaction chamber, the method comprising:

a first metal nitride sub-cycle comprising:
contacting the substrate with a first vapor-phase metal precursor comprising a first metal to form at most a molecular monolayer of the metal precursor on the substrate; and
contacting the substrate with a vapor phase nitrogen reactant, such that the nitrogen reactant reacts with the metal precursor on the substrate to form a metal nitride; and a second elemental metal sub-cycle comprising:
contacting the substrate with a second vapor phase metal precursor comprising a second metal different from the first metal to form at most a molecular monolayer of second metal precursor on the substrate; and
contacting the substrate with a vapor phase second reactant that reacts with the second metal precursor to form elemental metal; and repeating the first and second sub-cycles to form a ternary metal nitride film of a desired thickness, wherein the ternary metal nitride film has a roughness of less than 2 nm as measured by x-ray reflectivity.

16. The method of claim 15, wherein the second elemental metal sub-cycle is performed before the first metal nitride sub-cycle.

17. The method of claim 15, wherein the first metal is selected from Ti, Ta, Nb, Mo and W and the second metal is selected from Mo and W.

18. The method of claim 15, wherein the second reactant comprises a silane or borane.

19. The method of claim 15, wherein the first sub-cycle and second sub-cycle are repeated at a selected ratio in a plurality of super-cycles.

20. The method of claim 19, wherein the first sub-cycle is repeated no more than about 40 times consecutively and the second sub-cycle is repeated no more than about 10 times consecutively in each of the plurality of super-cycles.

21. The method of claim 15, wherein the roughness of less than about 2 nm is at a film thickness of about 20 to about 50 nm.

* * * * *